United States Patent
Yamashita

(10) Patent No.: US 12,207,460 B2
(45) Date of Patent: Jan. 21, 2025

(54) METHOD OF MANUFACTURING SEMICONDUCTOR DEVICE HAVING A SUBTRATE WITH A PROTRUDING PORTION HAVING DIFFERENT HEIGHTS IN REGIONS OVERLAPPED WITH DIFFERENT GATE ELECTRODES

(71) Applicant: Renesas Electronics Corporation, Tokyo (JP)

(72) Inventor: Tomohiro Yamashita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 573 days.

(21) Appl. No.: 16/887,011

(22) Filed: May 29, 2020

(65) Prior Publication Data

US 2020/0295018 A1    Sep. 17, 2020

Related U.S. Application Data

(60) Continuation of application No. 16/019,862, filed on Jun. 27, 2018, now abandoned, which is a division of
(Continued)

(30) Foreign Application Priority Data

Aug. 26, 2015  (JP) .................................. 2015-167218

(51) Int. Cl.
  H10B 41/30       (2023.01)
  H01L 21/28       (2006.01)
  (Continued)

(52) U.S. Cl.
  CPC ..... H10B 41/30 (2023.02); H01L 21/823431 (2013.01); H01L 27/1211 (2013.01);
  (Continued)

(58) Field of Classification Search
  CPC ....... H01L 21/823431; H01L 27/11521; H01L 27/11568; H01L 27/1157; H01L 27/11573;
  (Continued)

(56) References Cited

U.S. PATENT DOCUMENTS 7,105,390 B2  9/2006 Brask et al.
9,214,358 B1  12/2015 Lin et al.
(Continued)

FOREIGN PATENT DOCUMENTS

CN    103545317 A    1/2014
JP    2006-041354 A  2/2006
(Continued)

OTHER PUBLICATIONS

Office Action issued Dec. 20, 2021, in Chinese Patent Application No. 201610578765.2.
(Continued)

*Primary Examiner* — Joshua Benitez Rosario
*Assistant Examiner* — Scott E Bauman
(74) *Attorney, Agent, or Firm* — Rimon P.C.

(57) ABSTRACT

A semiconductor device includes: a fin that is a portion of a semiconductor substrate, protrudes from a main surface of the semiconductor substrate, has a width in a first direction, and extends in a second direction; a control gate electrode that is arranged on the fin via a first gate insulating film and extends in the first direction; and a memory gate electrode that is arranged on the fin via a second gate insulating film and extends in the first direction. Further, a width of the fin in a region in which the memory gate electrode is arranged via the second gate insulating film having a film thickness larger than the first gate insulating film is smaller than a width of the fin in a region in which the control gate electrode is arranged via the first gate insulating film.

3 Claims, 27 Drawing Sheets

Related U.S. Application Data application No. 15/213,369, filed on Jul. 18, 2016, now Pat. No. 10,043,814.

(51) Int. Cl.
| | |
|---|---|
| *H01L 21/8234* | (2006.01) |
| *H01L 27/12* | (2006.01) |
| *H01L 29/417* | (2006.01) |
| *H01L 29/423* | (2006.01) |
| *H01L 29/66* | (2006.01) |
| *H01L 29/78* | (2006.01) |
| *H01L 29/792* | (2006.01) |
| *H10B 43/30* | (2023.01) |
| *H10B 43/35* | (2023.01) |
| *H10B 43/40* | (2023.01) |

(52) U.S. Cl.
CPC .......... *H01L 29/40117* (2019.08); *H01L 29/41791* (2013.01); *H01L 29/42344* (2013.01); *H01L 29/42376* (2013.01); *H01L 29/66795* (2013.01); *H01L 29/66818* (2013.01); *H01L 29/66833* (2013.01); *H01L 29/7855* (2013.01); *H01L 29/792* (2013.01); *H10B 43/30* (2023.02); *H10B 43/35* (2023.02); *H10B 43/40* (2023.02)

(58) Field of Classification Search
CPC .......... H01L 27/1211; H01L 29/40117; H01L 29/41791; H01L 29/42344; H01L 29/42376; H01L 29/66795; H01L 29/66818; H01L 29/66833; H01L 29/7855; H01L 29/792; H10B 41/30; H10B 43/30; H10B 43/35; H10B 43/40
See application file for complete search history.

(56) References Cited

U.S. PATENT DOCUMENTS

| | | | |
|---|---|---|---|
| 9,576,980 B1 | 2/2017 | Basker et al. | |
| 2003/0042533 A1* | 3/2003 | Noro | H01L 29/42324 257/E21.422 |
| 2005/0098822 A1 | 5/2005 | Mathew et al. | |
| 2005/0269629 A1 | 12/2005 | Lee et al. | |
| 2006/0022260 A1 | 2/2006 | Hisamoto et al. | |
| 2006/0044873 A1 | 3/2006 | Katayama et al. | |
| 2006/0081910 A1* | 4/2006 | Yu | H01L 29/7887 257/315 |
| 2006/0289944 A1* | 12/2006 | Lee | H10B 69/00 257/E27.103 |
| 2007/0247906 A1 | 10/2007 | Watanabe et al. | |
| 2009/0045454 A1 | 2/2009 | Takaya et al. | |
| 2009/0050956 A1* | 2/2009 | Ishimaru | H01L 29/792 257/E21.409 |
| 2009/0309162 A1* | 12/2009 | Baumgartner | H01L 29/785 257/E25.01 |
| 2010/0187575 A1 | 7/2010 | Baumgartner et al. | |
| 2010/0264479 A1* | 10/2010 | Toba | H01L 29/42328 257/E27.103 |
| 2011/0057247 A1 | 3/2011 | Hu et al. | |
| 2011/0147848 A1* | 6/2011 | Kuhn | H01L 21/823431 257/E21.546 |
| 2012/0292707 A1 | 11/2012 | Toh et al. | |
| 2013/0009254 A1* | 1/2013 | Russ | H01L 23/5256 257/E27.014 |
| 2013/0224936 A1* | 8/2013 | Lee | H01L 21/823431 438/492 |
| 2013/0270627 A1 | 10/2013 | Cheng et al. | |
| 2013/0320448 A1 | 12/2013 | Cappellani et al. | |
| 2014/0008716 A1 | 1/2014 | Arigane et al. | |
| 2014/0077296 A1* | 3/2014 | Yamashita | H01L 27/0886 257/347 |
| 2014/0077303 A1 | 3/2014 | Baek | |
| 2014/0239377 A1* | 8/2014 | Nishida | H01L 27/11573 438/591 |
| 2014/0319623 A1 | 10/2014 | Tsai et al. | |
| 2015/0187634 A1 | 7/2015 | Chiang et al. | |
| 2015/0270279 A1* | 9/2015 | Arigane | H01L 21/76224 438/283 |

FOREIGN PATENT DOCUMENTS

| | | | |
|---|---|---|---|
| JP | 2006-066564 A | | 3/2006 |
| JP | 2006332143 A | * | 12/2006 |
| JP | 2007-266209 A | | 10/2007 |
| JP | 2013-504221 A | | 2/2013 |
| JP | 2014-017343 A | | 1/2014 |

OTHER PUBLICATIONS

Extended European Search Report, issued May 23, 2017, in European Patent Application No. 16183571.5.

Kamei et al., "Demonstration of Split-Gate Type Trigate Flash Memory with Highly Suppressed Over-Erase," *IEEE Electron Device Letters*, Mar. 2012, 33(3): pp. 345-347.

Liu et al., "Charge Trapping Type SOI-FinFET Flash Memory," *ECS Transactions*, Mar. 2014, 61(2): pp. 263-280.

Partial European Search Report, issued Jan. 23, 2017, in European Patent Application No. 16183571.5.

Office Action, issued Dec. 17, 2018, in European Application No. 16183571.5.

Office Action, issued Feb. 19, 2019, in Japanese Application No. 2015-167218.

Office Action issued Sep. 23, 2021, in Chinese Patent Application No. 201610578765.2.

Office Action issued Apr. 23, 2021, in Chinese Patent Application No. 201610578765.2.

\* cited by examiner

| OPERATION \ APPLIED VOLTAGE | Vd | Vcg | Vmg | Vs | Vb |
|---|---|---|---|---|---|
| WRITE | Vdd | 1V | 12V | 6V | 0 |
| ERASE | 0 | 0 | −6V | 6V | 0 |
| READ | Vdd | Vdd | 0 | 0 | 0 |

Vdd = 1.5V

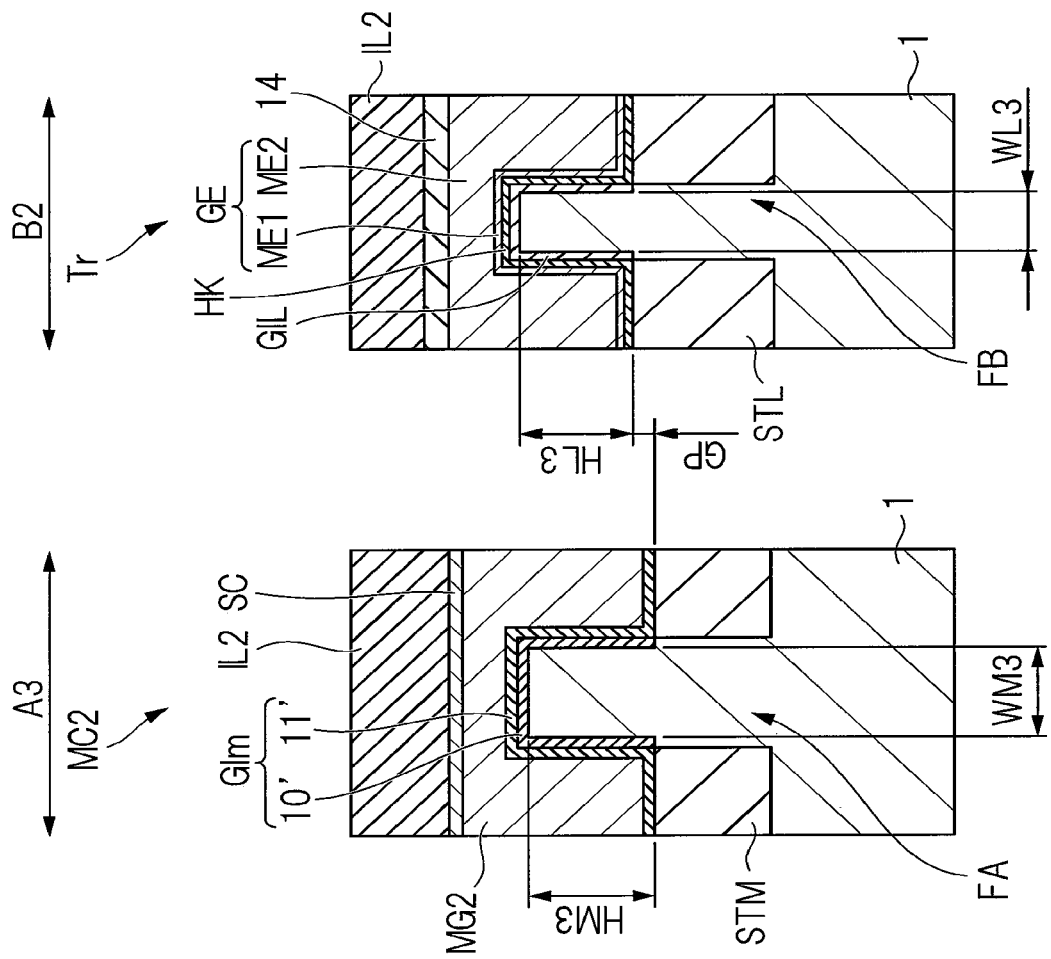

METHOD OF MANUFACTURING SEMICONDUCTOR DEVICE HAVING A SUBTRATE WITH A PROTRUDING PORTION HAVING DIFFERENT HEIGHTS IN REGIONS OVERLAPPED WITH DIFFERENT GATE ELECTRODES

CROSS-REFERENCE TO RELATED APPLICATION

The present application claims priority from Japanese Patent Application No. 2015-167218 filed on Aug. 26, 2015, the content of which is hereby incorporated by reference into this application.

TECHNICAL FIELD OF THE INVENTION

The present invention relates to a semiconductor device and can be effectively applied to, for example, a semiconductor device having a non-volatile memory.

BACKGROUND OF THE INVENTION

An EEPROM (Electrically Erasable and Programmable Read Only Memory) has been widely used as an electrically writable and erasable non-volatile semiconductor memory device. These memory devices which have been widely used at present and are represented by a flash memory include a conductive floating gate electrode or a trap insulating film surrounded by an oxide film under a gate electrode of a MISFET, and are configured to store the charge accumulation state of the floating gate electrode or the trap insulating film as memory information and read the memory information as a threshold of the transistor. This trap insulating film indicates an insulating film which is capable of accumulating a charge, and examples thereof include a silicon nitride film and the like. The threshold of the MISFET is shifted by injecting or releasing the charge into or from such a charge accumulating region, thereby operating the MISFET as the memory element. Examples of the flash memory include a split gate cell using a MONOS (Metal-Oxide-Nitride-Oxide-Semiconductor) film. Such a memory uses a silicon nitride film as the charge accumulating region, and is thus advantageous in terms of discretely accumulating the charge and having excellent reliability of data retention as compared to the conductive floating gate film. In addition, since the memory has the excellent reliability of data retention, it is possible to reduce the thickness of oxide films above and below the silicon nitride film, and thus a voltage required for write and erase operations can be lowered.

Further, a memory cell includes a control gate electrode (selection gate electrode) which is formed on a semiconductor substrate via a first gate insulating film, a memory gate electrode which is formed on the semiconductor substrate via a second gate insulating film including the charge accumulating region, and a pair of semiconductor regions (source region and drain region) formed in a surface of the semiconductor substrate so as to sandwich the control gate electrode and the memory gate electrode.

Further, Japanese Patent Application Laid-Open Publication No. 2006-41354 (Patent Document 1) discloses a memory cell in which a convex-shaped active region is formed on a surface of a semiconductor substrate and a control gate electrode and a memory gate electrode are arranged so as to be laid across the convex-shaped active region.

In addition, Japanese Patent Application Laid-Open Publication No. 2013-504221 (Patent Document 2) discloses a Fin-FET non-volatile memory cell including a word line arranged so as to be laid across a fin shaped member, a floating gate positioned immediately adjacent to the word line and capacitively coupled to a side surface of the fin shaped member, and a coupling gate positioned above the floating gate and capacitively coupled to the floating gate.

In addition, US Patent Application Publication No. 2014/0077303 (Patent Document 3) discloses a fin transistor that includes different fin widths.

SUMMARY OF THE INVENTION

Further improvement in performance in the semiconductor device including a fin-type non-volatile memory has been demanded.

Other problems and novel features will be apparent from description of the present specification and the attached drawings.

According to an embodiment, a semiconductor device includes: a protruding portion that is a portion of a semiconductor substrate, protrudes from a main surface of the semiconductor substrate, has a width in a first direction, and extends in a second direction; a first gate electrode that is arranged on the protruding portion via a first insulating film and extends in the first direction; and a second gate electrode that is arranged on the protruding portion via a second insulating film and extends in the first direction. Further, a width of the protruding portion in a region in which the second gate electrode is arranged via the second insulating film having a larger film thickness than the first insulating film is smaller than a width of the protruding portion in a region in which the first gate electrode is arranged via the first insulating film.

According to an embodiment, it is possible to improve the performance of the semiconductor device.

BRIEF DESCRIPTIONS OF THE DRAWINGS

FIG. 28 is a cross-sectional view showing the principal part of the semiconductor device according to the modification example 4.

DESCRIPTIONS OF THE PREFERRED EMBODIMENTS

Figure 1:
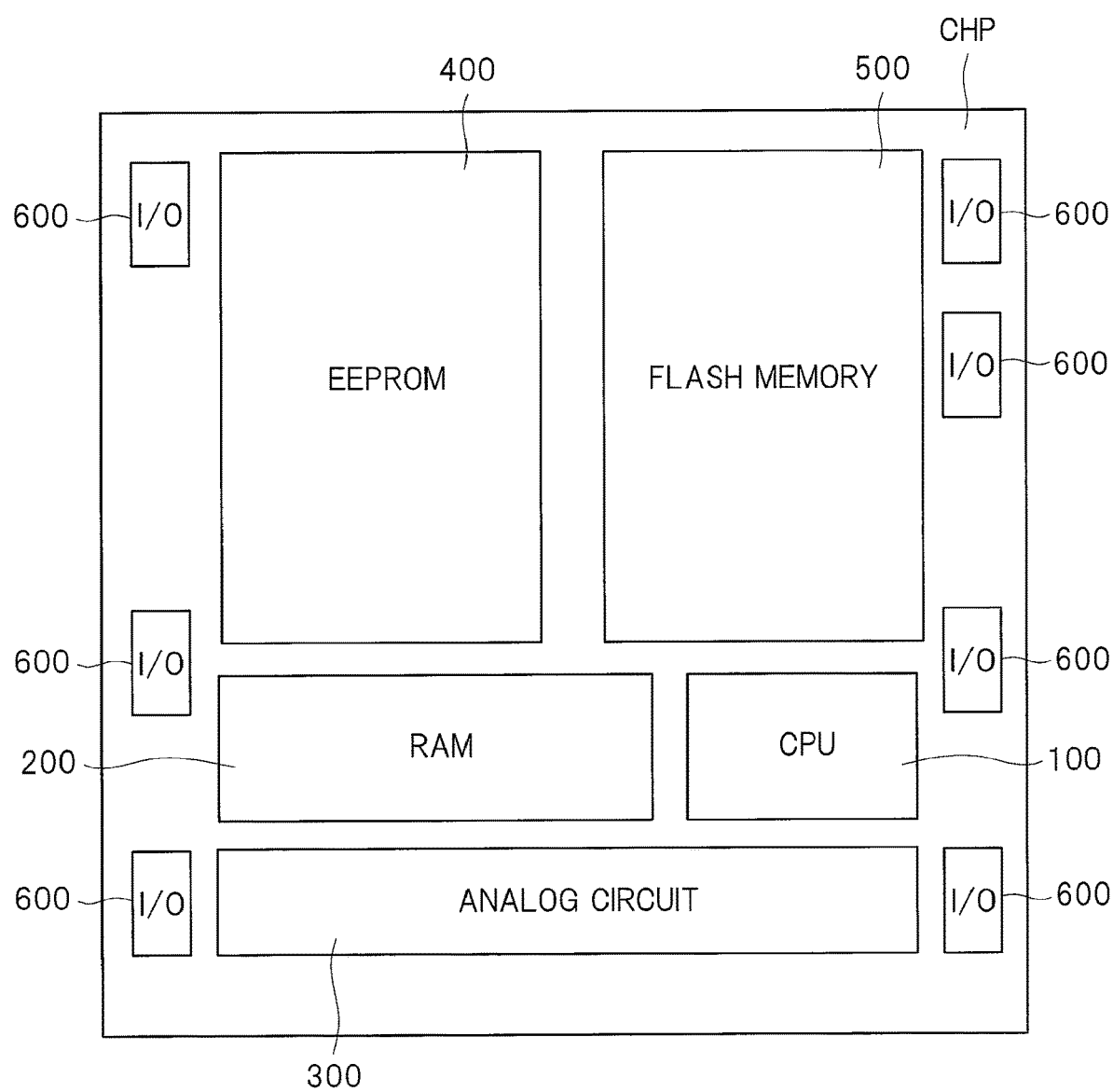
FIG. 1 is a diagram showing a layout configuration example of a semiconductor device (semiconductor chip) according to an embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

(Embodiment)

<Layout Configuration Example of Semiconductor Chip>

A semiconductor device including a non-volatile memory according to an embodiment will be described with reference to the drawings. First, a layout configuration of the semiconductor device (semiconductor chip) in which a system including a non-volatile memory is formed will be described. FIG. 1 is a diagram showing a layout configuration example of a semiconductor chip CHP according to this embodiment. In FIG. 1, the semiconductor chip CHP includes a CPU (Central Processing Unit) 100, a RAM (Random Access Memory) 200, an analog circuit 300, an EEPROM (Electrically Erasable Programmable Read Only Memory) 400, a flash memory 500, and an I/O (input/output) circuit 600, and they form a semiconductor device.

The CPU (circuit) 100 is referred to also as a central processing unit, and is configured to read and decode an instruction from a memory device and perform various types of operation and control based on the instruction.

The RAM (circuit) 200 is a memory which can read and write memory information at random, that is, can read the stored information and can newly write the information as needed, and it is referred to also as a randomly writable and readable memory. A static RAM (SRAM) using a static circuit is used as the RAM.

The analog circuit 300 is a circuit which handles a signal of voltage and current changed temporally in succession, that is, an analog signal, and it is composed of, for example, an amplifier circuit, a converter circuit, a modulator circuit, an oscillator circuit and a power source circuit.

Each of the EEPROM 400 and the flash memory 500 is a type of electrically-rewritable non-volatile memory for both of the write operation and the erase operation, and it is referred to also as an electrically erasable programmable read-only memory. The memory cell of each of the EEPROM 400 and the flash memory 500 is configured of, for example, a MONOS (Metal Oxide Nitride Oxide Semiconductor) transistor and a MNOS (Metal Nitride Oxide Semiconductor) transistor for storage (memory). The difference between the EEPROM 400 and the flash memory 500 is that the EEPROM 400 is a non-volatile memory from which the information is erasable, for example, in the unit of bytes, while the flash memory 500 is a non-volatile memory from which the information is erasable, for example, in the unit of word lines. In general, programs and the like to cause the CPU 100 to execute various types of processing are stored in the flash memory 500. On the other hand, various types of data which are frequently rewritten are stored in the EEPROM 400. The EEPROM 400 or the flash memory 500 includes an address buffer, a row decoder, a column decoder, a verifying sense amplifier circuit, a sense amplifier circuit, a write circuit and the like in addition to a memory cell array in which a plurality of non-volatile memory cells are arranged in a matrix form.

The I/O circuit 600 is an input/output circuit, and is provided to output data from inside of the semiconductor chip CHP to a device connected outside the semiconductor chip CHP and input data from the device connected outside the semiconductor chip CHP to the inside of the semiconductor chip CHP.

The semiconductor device according to this embodiment includes a memory cell formation region and a logic circuit formation region. The memory cell array in which the plurality of non-volatile memory cells are arranged in a matrix form is formed in the memory cell formation region, and the CPU 100, the RAM 200, the analog circuit 300, the I/O circuit 600, and the address buffer, the row decoder, the column decoder, the verifying sense amplifier circuit, the sense amplifier circuit, the write circuit, and the like of the EEPROM 400 or the flash memory 500 are formed in the logic circuit formation region.

<Device Structure of Semiconductor Device>

Figure 2:
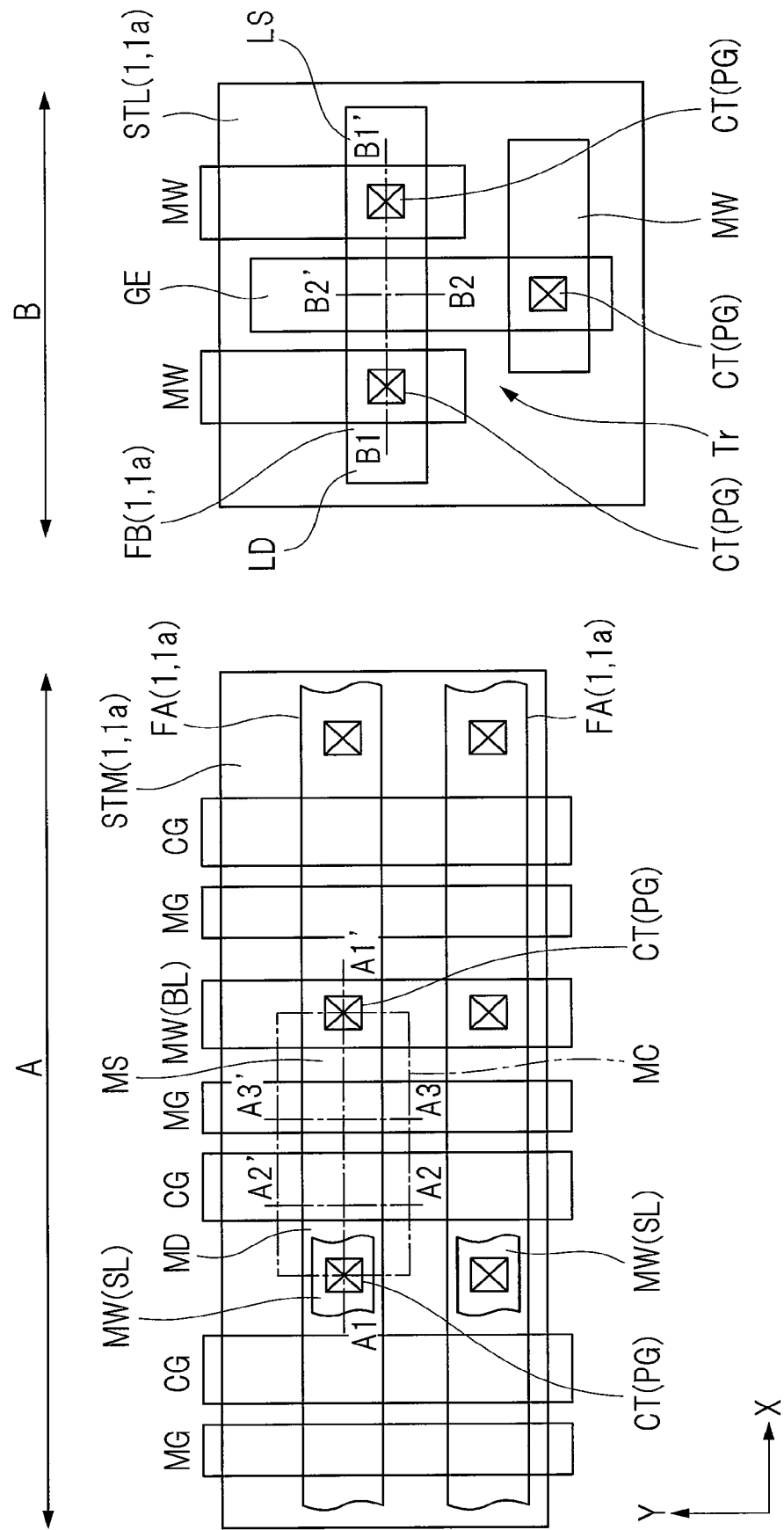
FIG. 2 is a plan view showing the principal part of the semiconductor device according to the embodiment.
Figure 3:
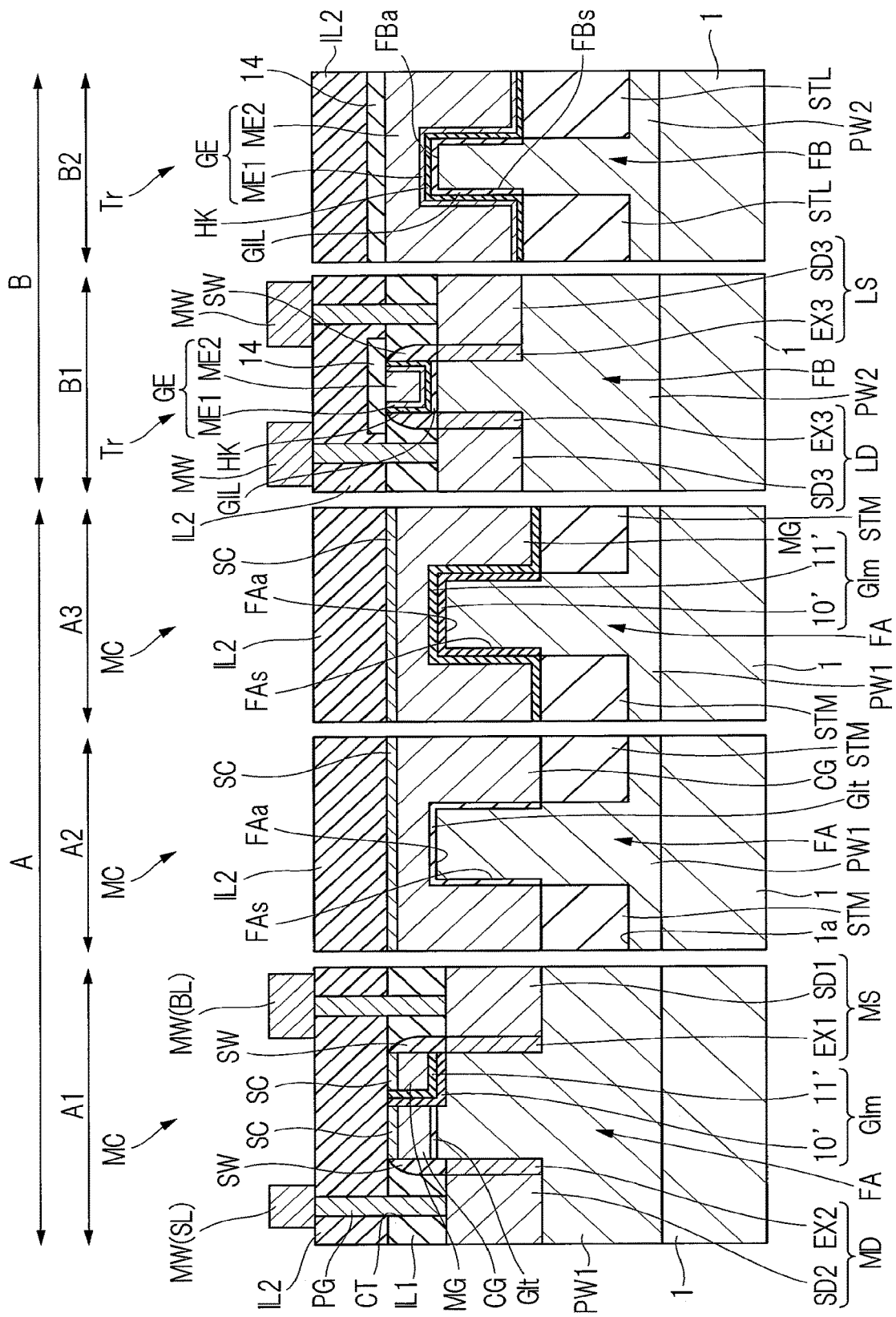
FIG. 3 is a cross-sectional view showing the principal part of the semiconductor device according to the embodiment.
Figure 4:
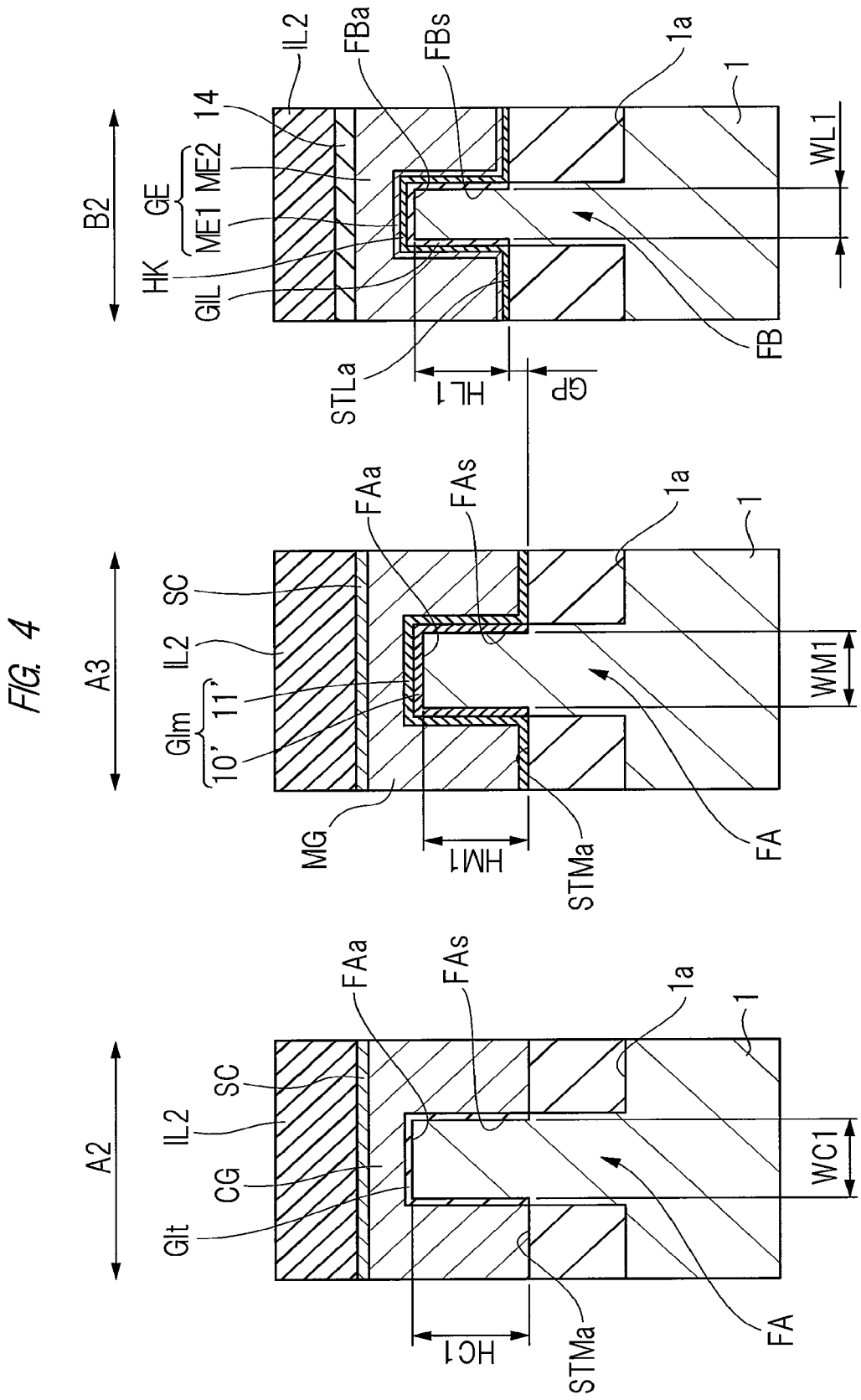
FIG. 4 is a cross-sectional view showing the principal part of the semiconductor device according to the embodiment.

FIG. 2 is a plan view showing the principal part of the semiconductor device according to this embodiment. In FIG. 2, a memory cell section A illustrates a plan view showing the principal part of the memory cell array, and a logic section B illustrates a plan view showing the principal part of a transistor Tr constituting the logic circuit or the like of the logic circuit formation region. An n-type MISFET (Metal Insulator Semiconductor Field Effect Transistor) is illustrated as the transistor Tr. FIG. 3 is a cross-sectional view showing the principal part of the semiconductor device according to this embodiment. FIG. 3 illustrates three cross-sectional views of the memory cell section A and two cross-sectional views of the logic section B. A memory cell section A1 is a cross-sectional view taken along the line A1-A1' of FIG. 2, a memory cell section A2 is a cross-sectional view taken along the line A2-A2' of FIG. 2, a memory cell section A3 is a cross-sectional view taken along the line A3-A3' of FIG. 2, a logic section B1 is a cross-sectional view taken along the line B1-B1' of FIG. 2, and a logic section B2 is a cross-sectional view taken along the line B2-B2' of FIG. 2. FIG. 4 is a cross-sectional view showing the principal part of the semiconductor device according to this embodiment. FIG. 4 illustrates a shape of a fin FA in each of the memory cell sections A2 and A3 and a shape of a fin FB in the logic section B2.

As shown in FIG. 2, a plurality of fins FA extending in the X-direction are arranged at equal intervals in the Y-direction in the memory cell section A. The fin FA is, for example, a protruding portion (convex portion) having a rectangular parallelepiped shape that selectively protrudes from a main surface of a semiconductor substrate 1, and a lower end portion of the fin FA is surrounded by an element isolation film STM that covers the main surface of the semiconductor substrate 1. The fin FA is a portion of the semiconductor substrate 1 and is an active region of the semiconductor substrate 1. Accordingly, the element isolation film STM is buried between the neighboring fins FA and the element isolation film STM surrounds the fin FA when seen in a plan view. The fin FA is the active region for forming a memory cell MC.

A plurality of control gate electrodes CG and a plurality of memory gate electrodes MG which extend in the Y-direction (direction orthogonal to the X-direction) are arranged on the plurality of fins FA. A drain region MD is formed on the side of the control gate electrode CG and a source region MS is formed on the side of the memory gate electrode MG so as to sandwich the control gate electrode CG and the memory gate electrode MG. The drain region MD and the source region MS are n-type semiconductor regions. The drain region MD is formed between the two neighboring control gate electrodes CG, and the source region MS is formed between the two neighboring memory gate electrodes MG. The memory cell MC includes the control gate electrode CG, the memory gate electrode MG, the drain region MD and the source region MS.

The drain region MD or the source region MS is shared between the two memory cells MC which are adjacent to each other in the X-direction. The two memory cells MC which share the drain region MD are mirror-symmetric with each other with respect to the drain region MD in the X-direction, and the two memory cells MC which share the source region MS are mirror-symmetric with each other with respect to the source region MS in the X-direction.

The plurality of memory cells MC are formed in the X-direction in each of the fins FA, and the drain regions MD of the plurality of memory cells MC arrayed in the X-direction are connected to source lines SL formed of metal wirings MW extending in the X-direction via plug electrodes PG which are formed in contact holes CT. In addition, the source regions MS of the plurality of memory cells MC arrayed in the Y-direction are connected to bit lines BL formed of metal wirings MW extending in the Y-direction. Preferably, a metal wiring in a layer different from that of the bit line BL is used for the source line SL.

In addition, for example, the fin FB extending in the X-direction is formed in the logic section B. The fin FB is an active region of the semiconductor substrate 1 like the fin FA, and a lower end portion of the fin FB is surrounded by an element isolation film STL that covers the main surface of the semiconductor substrate 1. A gate electrode GE extending in the Y-direction is arranged on the fin FB, and a drain region LD and a source region LS are formed for the fin FB so as to sandwich the gate electrode GE. The drain region LD and the source region LS are n-type semiconductor regions. The transistor Tr includes the gate electrode GE, the drain region LD, and the source region LS. Each of the gate electrode GE, the drain region LD and the source region LS is connected to the metal wiring MW via the plug electrode PG formed in the contact hole CT. The fin FB is the active region for forming the transistor Tr.

Each of the fins FA and FB is, for example, the protruding portion having a rectangular parallelepiped shape that protrudes from the main surface 1a of the semiconductor substrate 1 in the direction vertical to the main surface 1a. Each of the fins FA and FB has an arbitrary length in a long-side direction, an arbitrary width in a short-side direction and an arbitrary height in a height direction. Each of the fins FA and FB does not necessarily have the rectangular parallelepiped shape, and may also have a rectangular shape with corners being rounded when seen in a cross-sectional view in the short-side direction. In addition, each extending direction of the fins FA and FB when seen in a plan view is the long-side direction, and a direction orthogonal to the long-side direction is the short-side direction. Namely, the length is larger than the width. Each of the fins FA and FB may have any shape as long as it is formed as the protruding portion having a length, a width and a height. For example, the fins FA and FB may have a meandering pattern when seen in a plan view.

Next, the structures of the memory cell MC and the transistor Tr will be described with reference to FIG. 3.

The fin FA which is the protruding portion of the semiconductor substrate 1 is formed in the memory cell section A of the semiconductor substrate 1. A lower portion of the fin FA is surrounded by the element isolation film STM which is formed on the main surface 1a of the semiconductor substrate 1. Namely, the fins FA are isolated from one another by the element isolation film STM. A p-type well PW1 which is a p-type semiconductor region is formed in the lower portion of the fin FA. In other words, the fin FA is formed in the p-type well PW1.

The control gate electrode CG is formed on a main surface FAa and a side surface FAs of the fin FA via a gate insulating film GIt, and the memory gate electrode MG is formed in a region neighboring to the control gate electrode CG in the long-side direction of the fin FA via a gate insulating film GIm. The gate insulating film GIm is interposed between the control gate electrode CG and the memory gate electrode MG, and the control gate electrode CG and the memory gate electrode MG are electrically isolated from each other by the gate insulating film GIm. The control gate electrode CG and the memory gate electrode MG may be electrically isolated by forming an insulating film other than the gate insulating film GIm therebetween.

Herein, the gate insulating film GIt is a thermal oxide film (silicon oxide film) formed by thermally oxidizing the main surface FAa and the side surface FAs of the fin FA which is the protruding portion of the semiconductor substrate 1 made of silicon, and has a film thickness of 2 nm. In addition, the gate insulating film GIm includes an insulating film 10' formed of a thermal oxide film (silicon oxide film) which is formed by thermally oxidizing the main surface FAa and the side surface FAs of the fin FA which is the protruding portion of the semiconductor substrate 1 made of silicon and has a film thickness of 4 nm and an insulating film 11' formed on the insulating film 10'. The insulating film 11' is formed of a stacked film including a silicon nitride film serving as a charge accumulation section (charge accumulating layer) and a silicon oxynitride film that covers a surface of the silicon nitride film. The silicon nitride film has a film thickness of 7 nm, and the silicon oxynitride film has a film thickness of 9 nm. Namely, the gate insulating film GIm has a stacked structure including the silicon oxide film, the silicon nitride film and the silicon oxynitride film, and has a film thickness of 20 nm, which is thicker than the gate insulating film GIt below the control gate electrode CG. The gate insulating film GIm may have a stacked structure including a silicon oxide film, a silicon nitride film and a silicon oxide film.

As shown in the memory cell section A2, the control gate electrode CG extends along the main surface FAa and the side surface FAs of the fin FA via the gate insulating film GIt in the short-side direction of the fin FA, and extends on the element isolation film STM surrounding the fin FA. Similarly, as shown in the memory cell section A3, the memory gate electrode MG extends along the main surface FAa and the side surface FAs of the fin FA via the gate insulating film GIm in the short-side direction of the fin FA, and extends on the element isolation film STM surrounding the fin FA. A silicide layer SC is formed on each main surface of the control gate electrode CG and the memory gate electrode MG.

In addition, the source region MS and the drain region MD are provided in the region outside the control gate electrode CG and the memory gate electrode MG so as to sandwich the control gate electrode CG and the memory gate electrode MG, the source region MS includes an $n^-$ semiconductor region EX1 and an $n^+$ semiconductor region SD1, and the drain region MD includes an $n^-$ semiconductor region EX2 and an $n^+$ semiconductor region SD2. The source region MS and the drain region MD are formed in the entire region of the fin FA that is exposed from the element isolation film STM in the short-side direction and the height direction.

A sidewall spacer SW and an interlayer insulating film IL1 are formed on each side wall of the control gate electrode CG and the memory gate electrode MG, and an interlayer insulating film IL2 is formed on the interlayer insulating film IL1 so as to cover the control gate electrode CG, the memory gate electrode MG, the source region MS and the drain region MD. The metal wiring MW is formed on the interlayer insulating film IL2, and the metal wiring MW is electrically connected to each of the source region MS and the drain region MD via the plug electrode PG which is provided in the contact hole CT formed in the interlayer insulating films IL2 and IL1.

The memory cell MC includes the control gate electrode CG, the memory gate electrode MG, the drain region MD and the source region MS. Further, a distance between the drain region MD and the source region MS in the long-side direction corresponds to a channel length of the memory cell MC, and a region of the control gate electrode CG or the memory gate electrode MG that opposes the main surface FAa and the side surface FAs of the fin FA in the short-side direction corresponds to a channel width of the memory cell MC.

The fin FB which is the protruding portion of the semiconductor substrate 1 is formed in the logic section B of the semiconductor substrate 1. A lower portion of the fin FB is surrounded by the element isolation film STL formed on the main surface 1a of the semiconductor substrate 1. Namely, the fins FB are isolated from one another by the element isolation film STL. A p-type well PW2 which is a p-type semiconductor region is formed in the lower portion of the fin FB. In other words, the fin FB is formed in the p-type well PW2.

The gate electrode GE is formed on a main surface FBa and a side surface FBs of the fin FB via a gate insulating film GIL and an insulating film HK. As shown in the logic section B2, the gate electrode GE extends along the main surface FBa and the side surface FBs of the fin FB via the gate insulating film GIL and the insulating film HK in the short-side direction of the fin FB, and extends on the element isolation film STL surrounding the fin FB. The gate electrode GE is configured to have a stacked structure of metal films ME1 and ME2.

In addition, the source region LS and the drain region LD provided in the region outside the gate electrode GE so as to sandwich the gate electrode GE include an $n^-$ semiconductor region EX3 and an $n^+$ semiconductor region SD3. The source region LS and the drain region LD are formed in the entire region of the fin FB exposed from the element isolation film STL in the short-side direction and the height direction.

As described later, the sidewall spacer SW and the interlayer insulating film IL1 are formed on the side wall of the gate electrode GE, and the interlayer insulating film IL2 is formed on the gate electrode GE and the interlayer insulating film IL1. Incidentally, an insulating film 14 is formed between the interlayer insulating film IL1 and the interlayer insulating film IL2 so as to cover and conceal the gate electrode GE. The metal wiring MW is formed on the interlayer insulating film IL2, and the metal wiring MW is electrically connected to each of the source region LS and the drain region LD via the plug electrode PG provided in the contact hole CT formed in the interlayer insulating films IL2 and IL1.

The transistor Tr includes the gate electrode GE, the drain region LD and the source region LS. Further, a distance between the drain region LD and the source region LS in the long-side direction corresponds to a channel length of the transistor Tr, and a region of the gate electrode GE that opposes the main surface FBa and the side surface FBs of the fin FB in the short-side direction corresponds to a channel width of the transistor Tr.

Incidentally, the p-type wells PW1 and PW2 are illustrated only in FIG. 3, and are not illustrated in the other drawings.

As shown in FIG. 4, a height HC1 of the fin FA is a distance from a main surface STMa of the element isolation film STM to the main surface FAa of the fin FA, and a width WC1 of the fin FA is a distance between the side walls FAs of the fin FA in the short-side direction in the memory cell section A2. In the memory cell section A3, a height HM1 of the fin FA is a distance from the main surface STMa of the element isolation film STM to the main surface FAa of the fin FA, and a width WM1 of the fin FA is a distance between the side walls FAs of the fin FA in the short-side direction. In the logic section B2, a height HL1 of the fin FB is a distance from the main surface STLa of the element isolation film STL to the main surface FBa of the fin FB, and a width WL1 of the fin FB is a distance between the side walls FBs of the fin FB in the short-side direction.

Incidentally, each width of the fins FA and FB means a width at a position at which each width of the fins FA and FB is the widest (largest) in the cross-section taken along a direction orthogonal to the extending direction of the fins FA and FB. In addition, the heights of the fins FA and FB mean distances from the main surfaces STMa and STLa of the element isolation films STM and STL to the highest positions of the fins FA and FB, respectively. Further, the main surfaces STMa and STLa of the element isolation films STM and STL are portions of the element isolation films STM and STL in contact with the fins FA and FB.

In this embodiment, each width of the fins FA and FB in the short-side direction is set as follows. That is, the width of the fin becomes smaller in the order of the width WC1 of the fin FA of the memory cell section A2, the width WM1 of the fin FA of the memory cell section A3 and the width WL1 of the fin FB of the logic section B2 (WC1>WM1>WL1).

In addition, each height of the fins FA and FB is set as follows. That is, the height of the fin becomes smaller in the order of the height HC1 of the fin FA of the memory cell section A2, the height HM1 of the fin FA of the memory cell section A3, and the height HL1 of the fin FB of the logic section B2 (HC1>HM1>HL1).

<Manufacturing Process of Semiconductor Device>

FIGS. 5 to 23 are cross-sectional views showing the principal part in the manufacturing process of the semiconductor device according to this embodiment.

First, a manufacturing process of the fin FA of the memory cell section A and the fin FB of the logic section B will be described.

Figure 5:
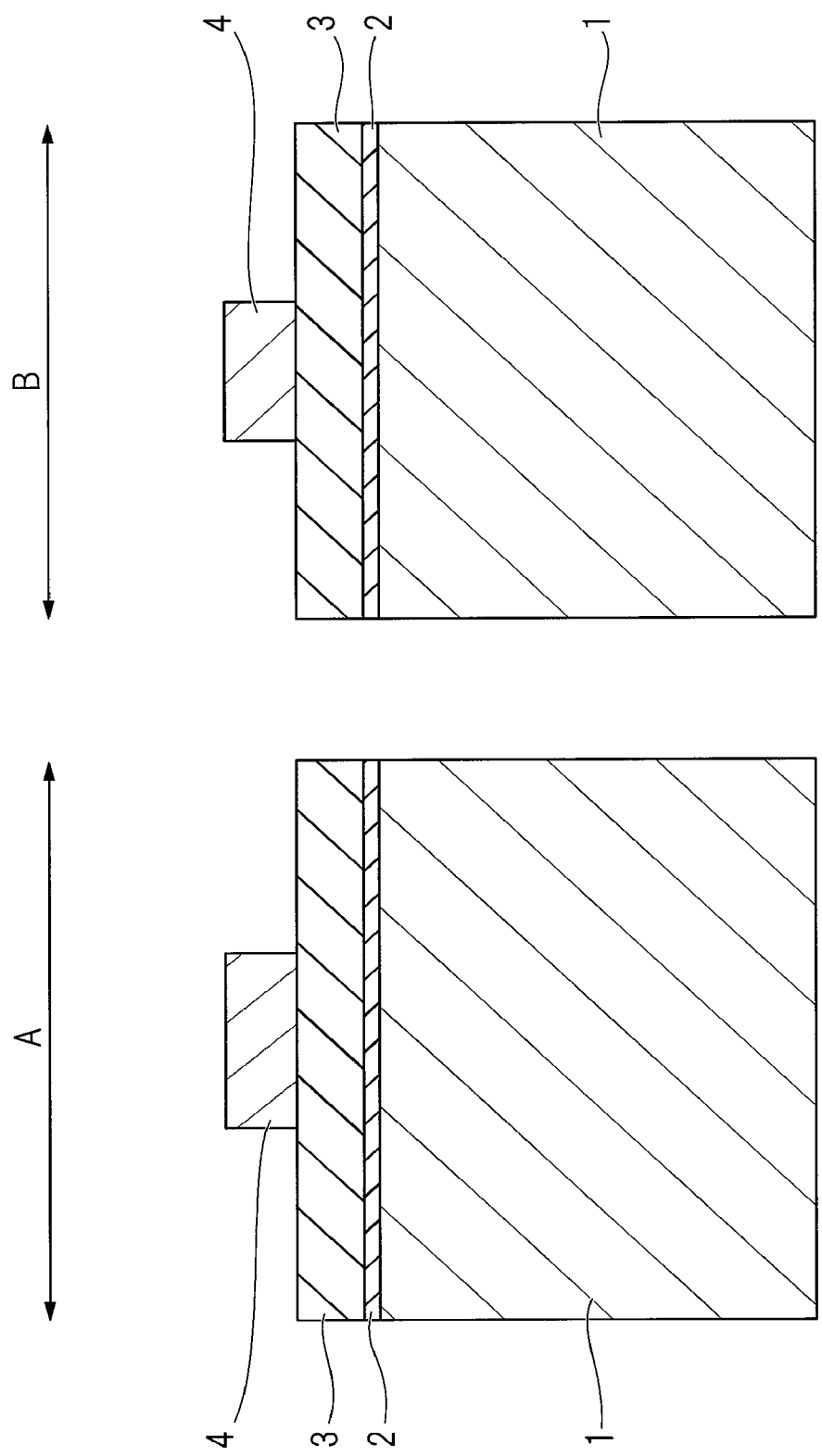
FIG. 5 is a cross-sectional view showing the principal part in the manufacturing process of the semiconductor device according to the embodiment.

FIG. 5 is a diagram describing a process of forming a mask film 4 for specifying a region to form the fins FA and FB (Step S1).

Insulating films 2 and 3 are deposited on the semiconductor substrate 1. The semiconductor substrate 1 is made of, for example, p-type monocrystalline silicon having a specific resistance of about 1 to 10 Ωcm. The insulating film 2 is made of a silicon oxide film, and has a film thickness of about 2 to 10 nm. The insulating film 3 is made of a silicon nitride film, and has a film thickness of about 20 to 100 nm.

Next, an amorphous silicon film is deposited on the insulating film 3 and is then patterned to have a desired shape, thereby forming the mask film 4 made of the amorphous silicon film. A film thickness of the mask film 4 is set to 20 to 200 nm. Since the fins FA and FB are formed on both ends of the mask film 4, it is possible to determine an interval of the neighboring fins FA and an interval of the neighboring fins FB by a width of the mask film 4.

Figure 6:
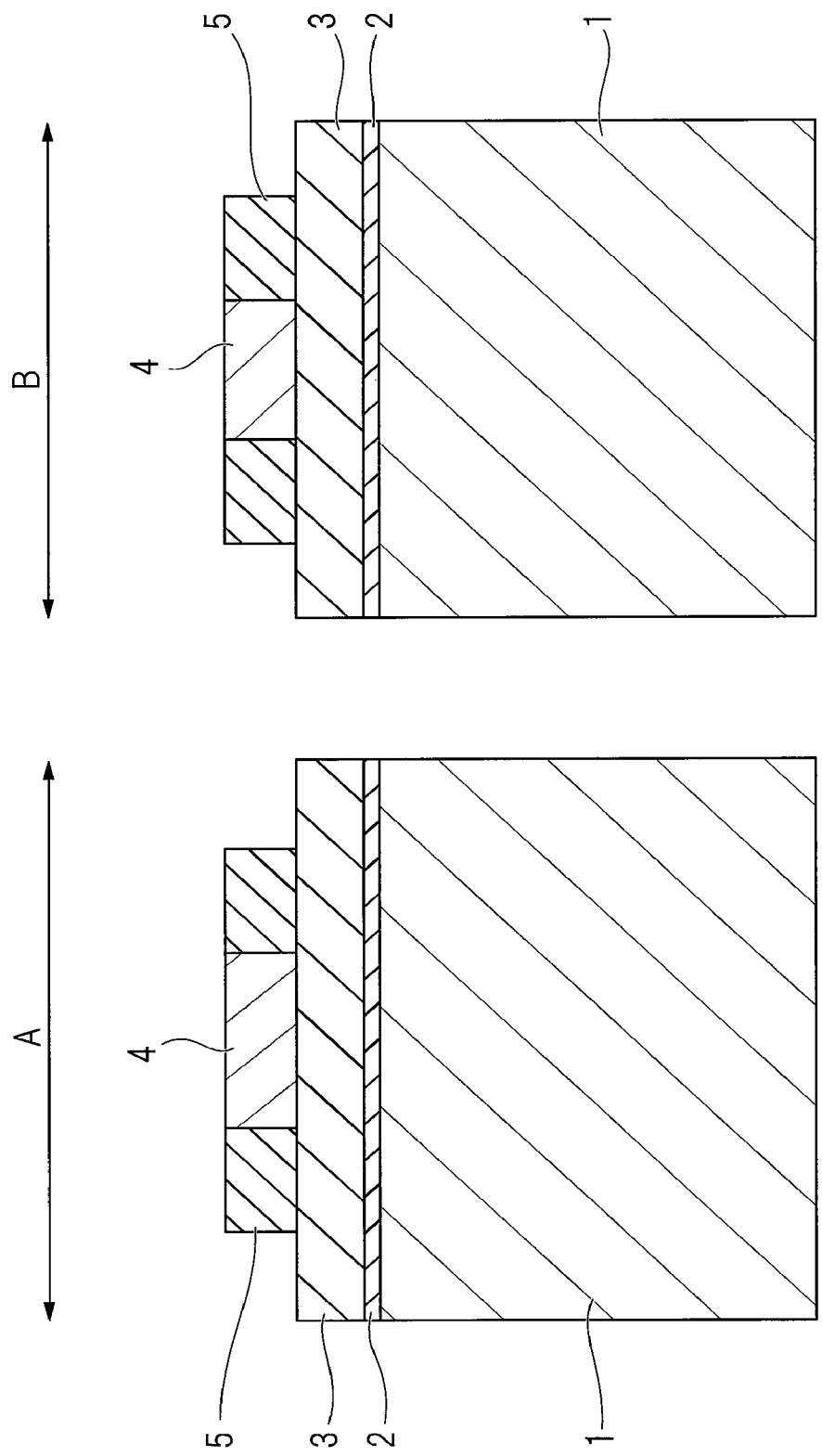
FIG. 6 is a cross-sectional view showing the principal part in the manufacturing process of the semiconductor device subsequent to FIG. 5.

FIG. 6 is a diagram describing a process of forming a hard mask film 5 for forming the fins FA and FB (Step S2).

A silicon oxide film having a film thickness of 10 to 40 nm is deposited on the semiconductor substrate 1 so as to cover an upper surface and side surfaces of the mask film 4, and then, the silicon oxide film is subjected to an anisotropic dry etching, thereby forming the hard mask film 5 on side walls of the mask film 4. A width of the hard mask film 5 is 10 to 40 nm. The mask film 4 is removed after forming the hard mask film 5.

Figure 7:
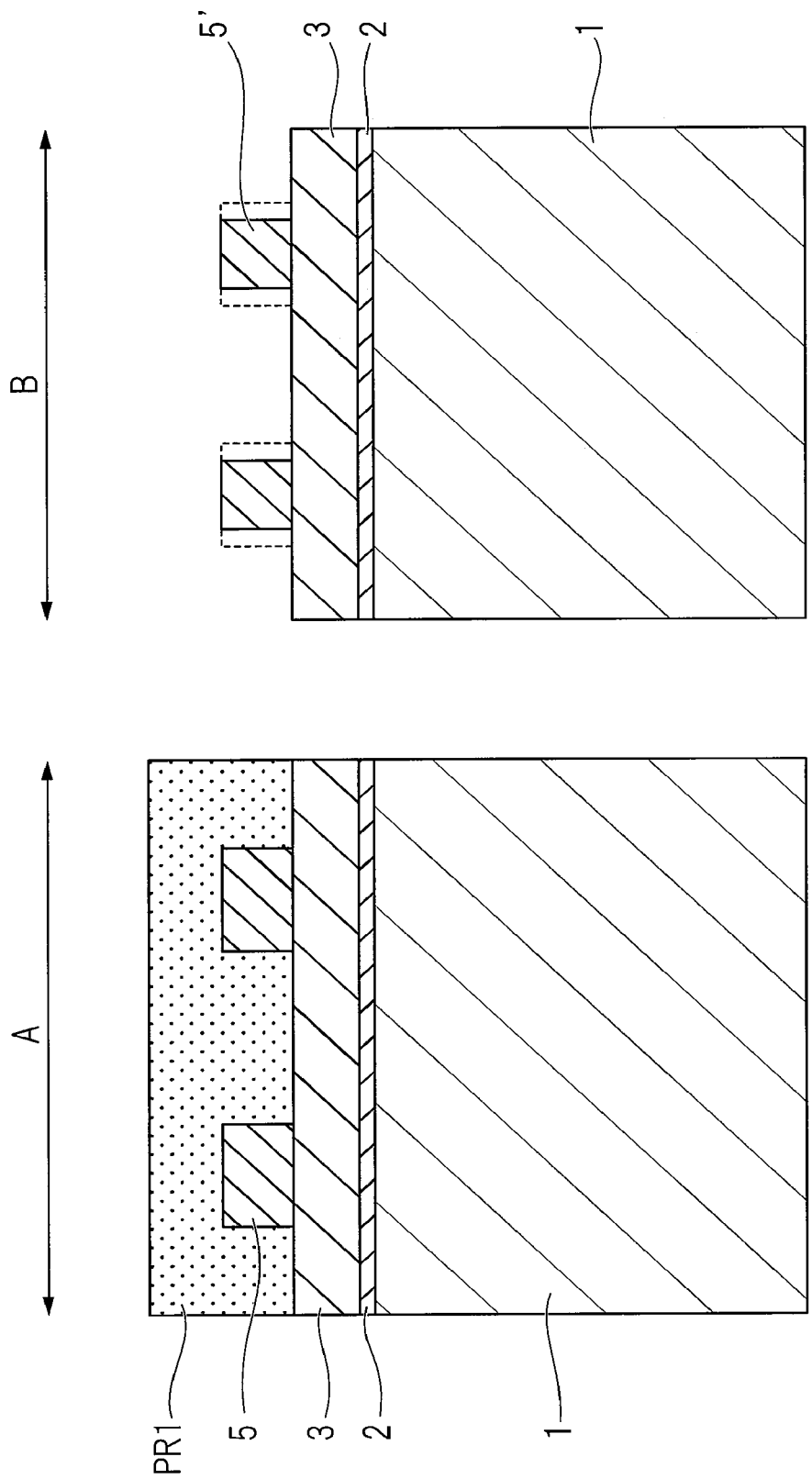
FIG. 7 is a cross-sectional view showing the principal part in the manufacturing process of the semiconductor device subsequent to FIG. 6.

FIG. 7 is a diagram describing a process of slimming the hard mask film 5 (Step S3).

A resist film PR1 is formed on the semiconductor substrate 1 so as to cover the memory cell section A and expose the logic section B, and then, the hard mask film 5 of the logic section B is subjected to a wet etching process to shorten (reduce) the width of the hard mask film 5. Namely, a hard mask film 5' having a width smaller than that of the hard mask film 5 of the memory cell section A is formed in the logic section B. The resist mask PR1 is removed after forming the hard mask film 5'. Although the hard mask film 5 of the logic section B is shortened herein, it is also possible to shorten the hard mask film 5 of the memory cell section A reversely by using a resist film that exposes the memory cell section A and covers the logic section B.

Figure 8:
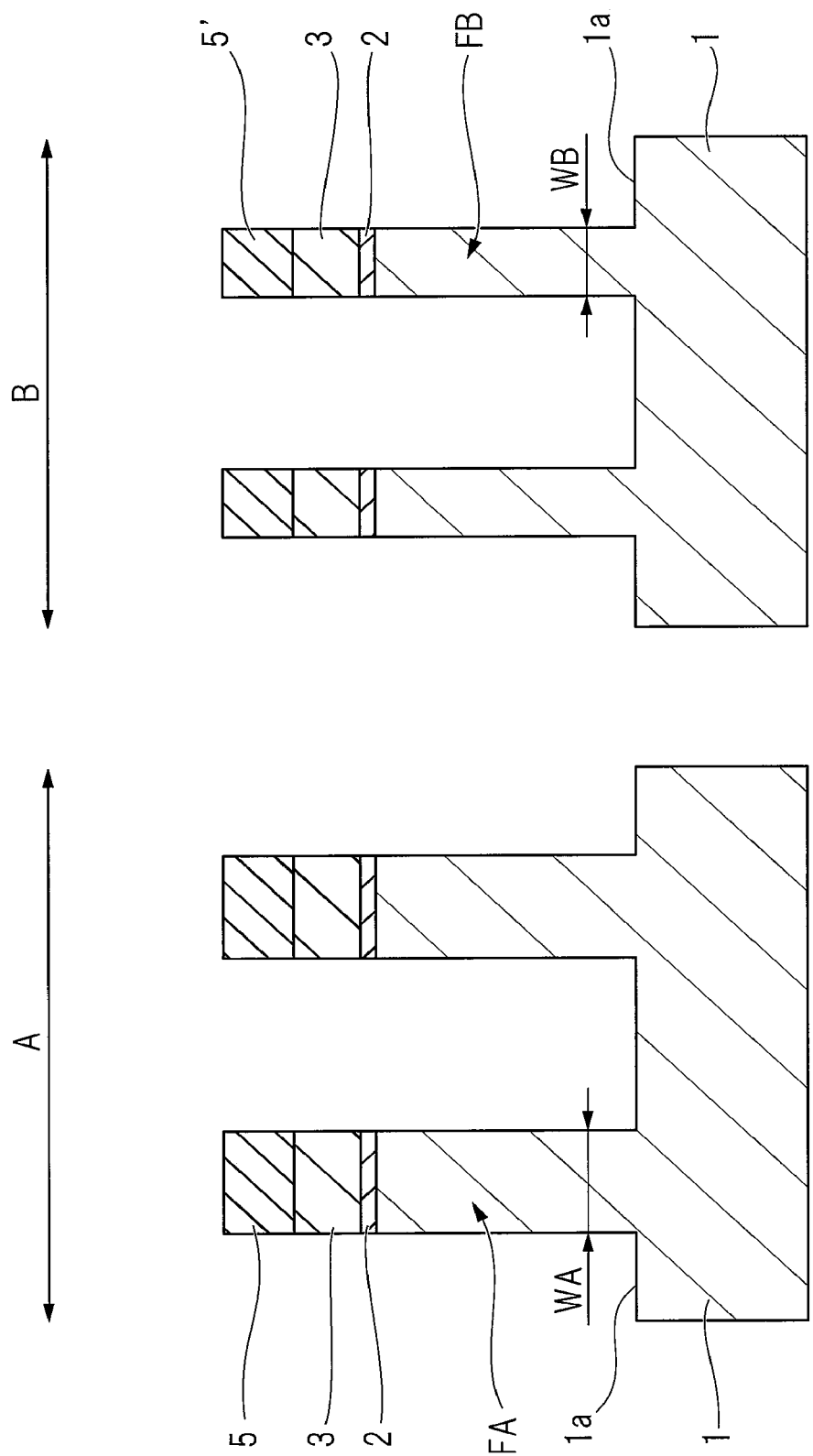
FIG. 8 is a cross-sectional view showing the principal part in the manufacturing process of the semiconductor device subsequent to FIG. 7.

FIG. 8 is a diagram describing a process of forming the fins FA and FB (Step S4).

The insulating films 3 and 2 and the semiconductor substrate 1 are subjected to an anisotropic dry etching using the hard mask films 5 and 5' as a mask, thereby forming the insulating films 3 and 2 and the fins FA and FB which have the same shapes as the hard mask films 5 and 5' when seen in a plan view. Incidentally, by digging the semiconductor substrate 1 of a region exposed from the hard mask films 5 and 5' by 100 to 250 nm, it is possible to form the fins FA and FB having a height of 100 to 250 nm from the main surface 1a of the semiconductor substrate 1. Of course, a width WA of the fin FA of the memory cell section A is larger than a width WB of the fin FB of the logic section B. Here, each width of the fin FA and FB is the length thereof in a direction intersecting the control gate electrode CG or the gate electrode GE described above. The hard mask films 5 and 5' are removed after forming the fins FA and FB.

Next, a process of forming the element isolation films STM and STL (Step S5) will be described.

Figure 9:
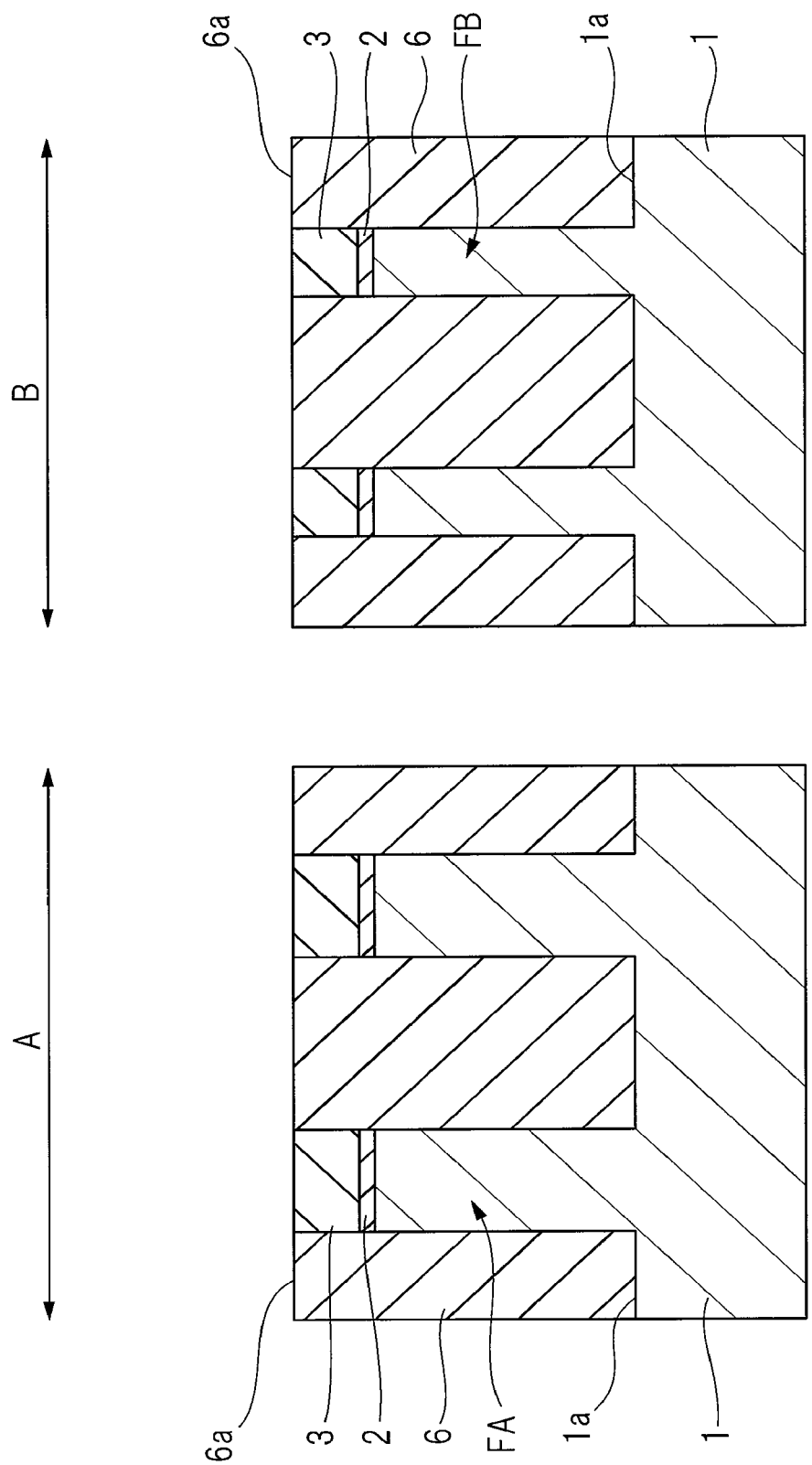
FIG. 9 is a cross-sectional view showing the principal part in the manufacturing process of the semiconductor device subsequent to FIG. 8.

An insulating film made of a silicon oxide film or the like is deposited on the semiconductor substrate 1 so as to completely bury the fins FA and FB and the insulating films 2 and 3, and the insulating film is subjected to a chemical mechanical polishing (CMP) process to expose a main surface of the insulating film 3. In this manner, an insulating film 6 having an even main surface 6a on the main surface 1a of the semiconductor substrate 1 is formed as shown in FIG. 9. The insulating films 3 and 2 are removed after forming the insulating film 6.

Figure 10:
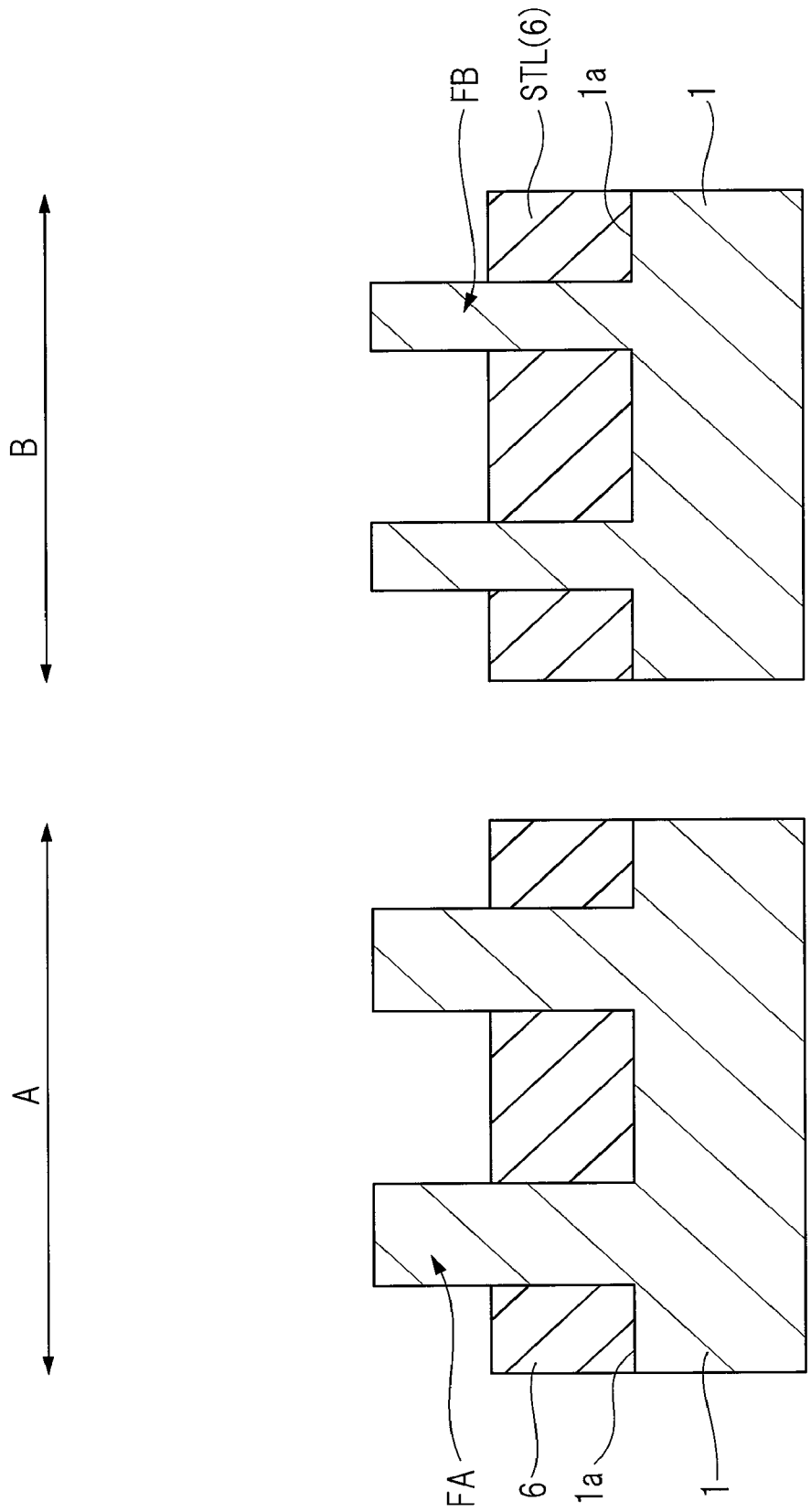
FIG. 10 is a cross-sectional view showing the principal part in the manufacturing process of the semiconductor device subsequent to FIG. 9.

Next, the insulating film 6 is subjected to an etching process, and the main surface 6a of the insulating film 6 is recessed (lowered) in the height direction to expose a part of the side surfaces and the main surface of the fins FA and FB as shown in FIG. 10. In this manner, the element isolation film STL is formed in the logic section B. Here, since the recessed amount of the insulating film 6 is equal in the memory cell section A and the logic section B, each exposed height of the fins FA and FB is the same.

Figure 11:
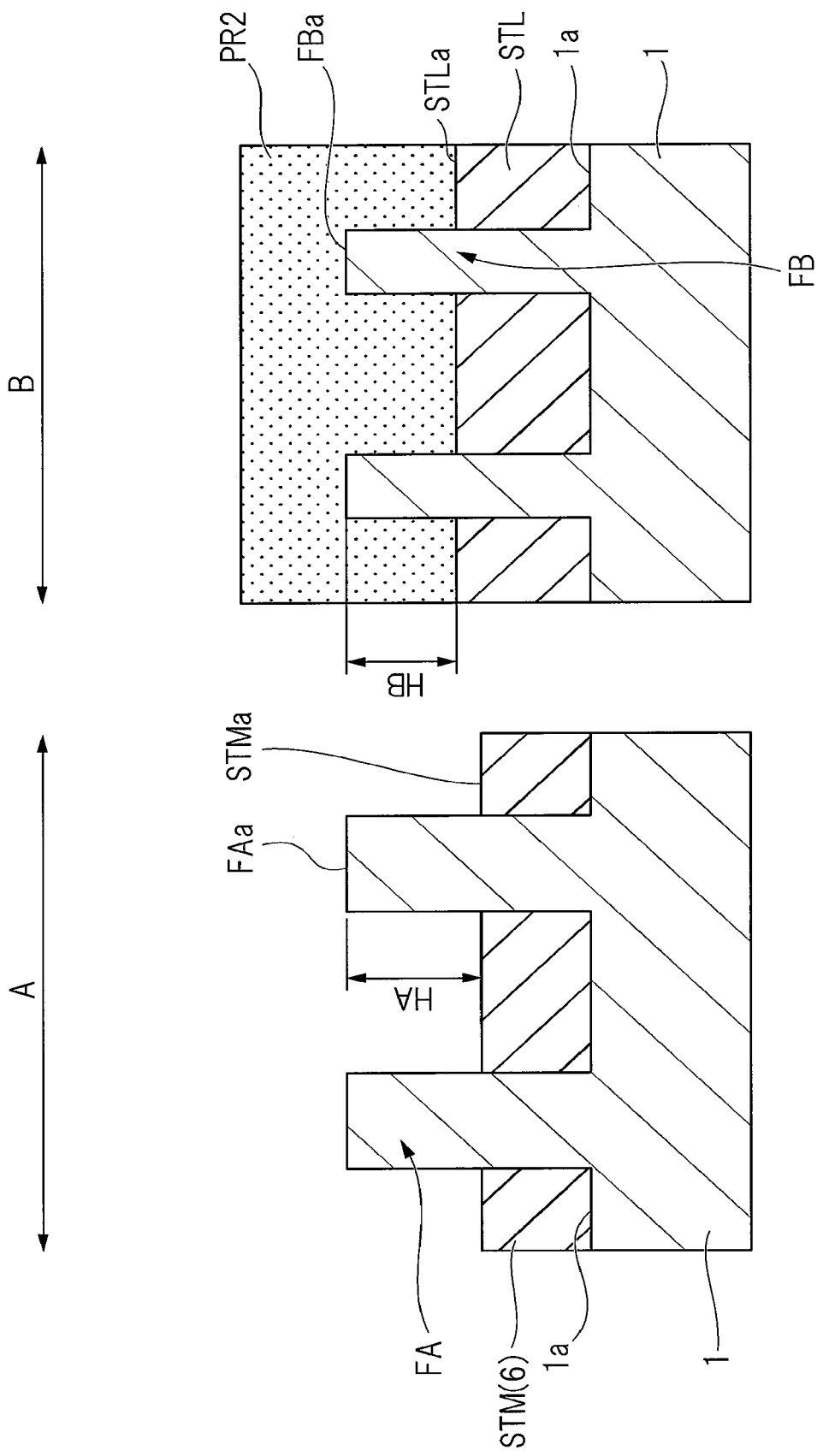
FIG. 11 is a cross-sectional view showing the principal part in the manufacturing process of the semiconductor device subsequent to FIG. 10.

Next, a process of adjusting each height of the fins FA and FB is performed as shown in FIG. 11. A resist film PR2 is formed on the semiconductor substrate 1 so as to cover the logic section B and expose the memory cell section A, the insulating film 6 of the memory cell section A is subjected to an etching process using the resist film PR2 as a mask, and the main surface of the insulating film 6 of the memory cell section A is further recessed (lowered). In this manner, the element isolation film STM having a main surface lower than the main surface of the element isolation film STL of the logic section B is formed in the memory cell section A. The resist film PR2 is removed after the etching process is completed.

In this manner, it is possible to form a structure in which a height HA of the fin FA exposed from the element isolation film STM is larger than a height HB of the fin FB exposed from the element isolation film STL. The height HA of the fin FA of the memory cell section A is a distance from the main surface STMa of the element isolation film STM to the main surface FAa of the fin FA, and the height HB of the fin FB of the logic section B is a distance from the main surface STLa of the element isolation film STL to the main surface FBa of the fin FB. Although the main surface of the insulating film 6 of the memory cell section A is recessed herein, it is also possible to set the height HB of the fin FB to be higher than the height HA of the fin FA reversely by processing the insulating film 6 of the logic section B to be recessed by using a resist film that exposes the logic section B and covers the memory cell section A.

Next, the manufacture of the memory cell MC and the transistor Tr will be described with reference to FIGS. 12 to 23. FIGS. 12 to 23 show the memory cell sections A1, A2 and A3 and the logic sections B1 and B2 like FIG. 3.

Figure 12:
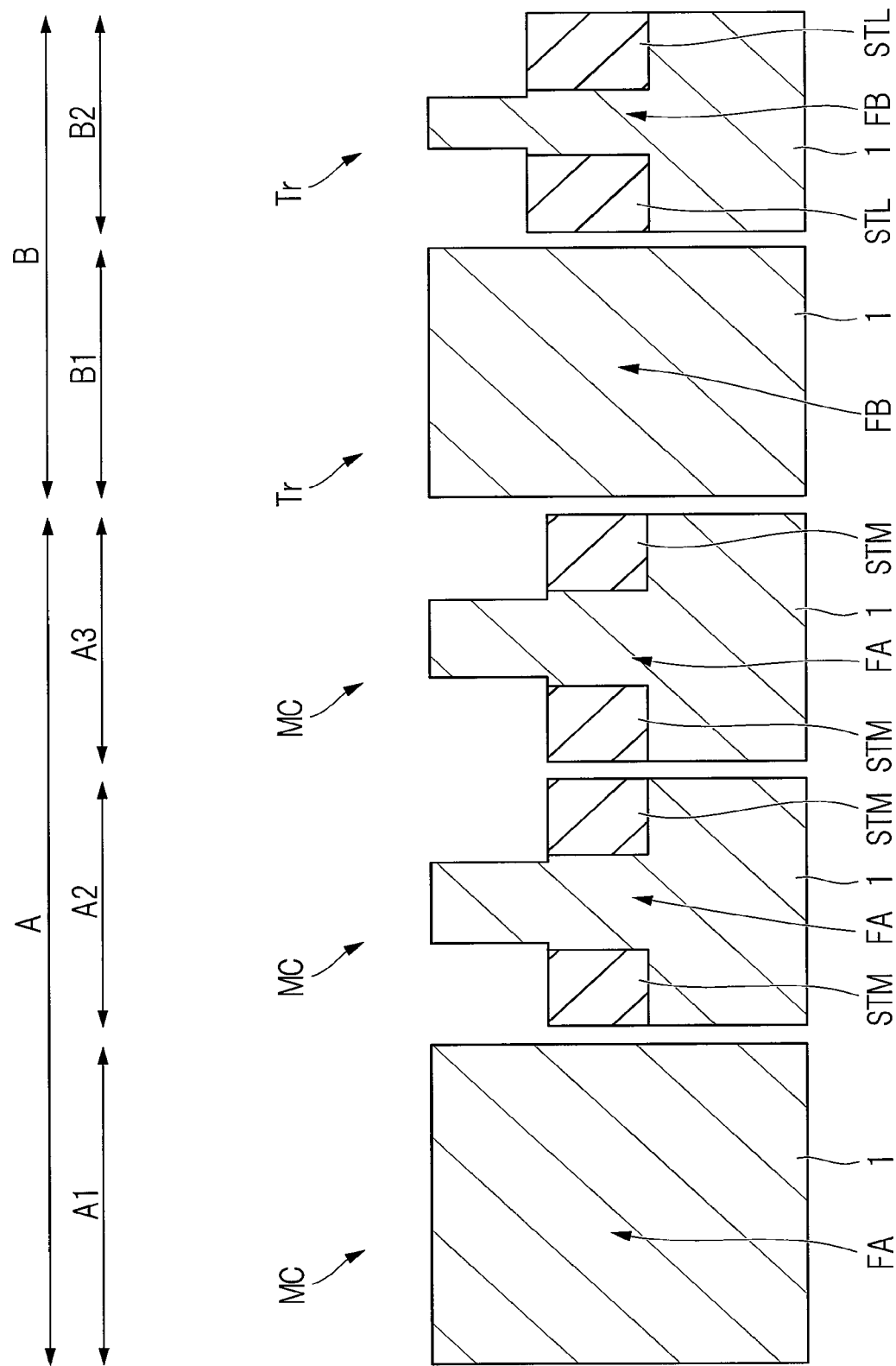
FIG. 12 is a cross-sectional view showing the principal part in the manufacturing process of the semiconductor device according to the embodiment.

As shown in FIG. 12, the fin FA has been prepared in the memory cell sections A1, A2 and A3, and the fin FB has been prepared in the logic sections B1 and B2. The width WA of the fin FA is larger than the width WB of the fin FB (WA>WB), and the height HA of the fin FA is larger than the height HB of the fin FB (HA>HB).

Figure 13:
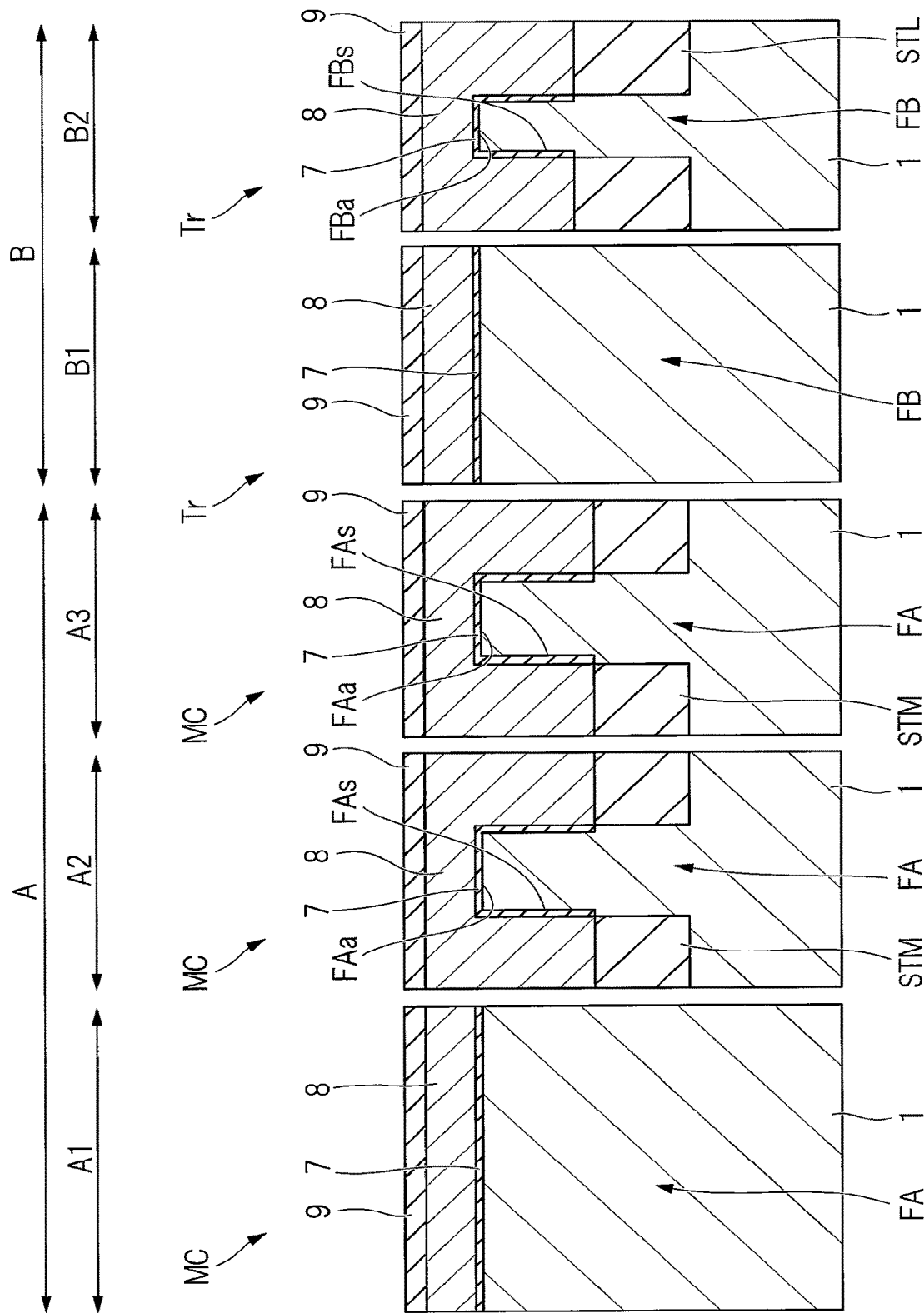
FIG. 13 is a cross-sectional view showing the principal part in the manufacturing process of the semiconductor device subsequent to FIG. 12.

FIG. 13 shows a process of forming an insulating film 7, a conductor film 8 and an insulating film 9 (Step S6). First, the insulating film 7 is formed on the main surfaces FAa and FBa and the side surfaces FAs and FBs of the fins FA and FB. The insulating film 7 is formed by thermally oxidizing the main surfaces FAa and FBa and the side surfaces FAs and FBs of the fins FA and FB to form a silicon oxide film of about 2 nm. Next, the conductor film 8 is deposited on the insulating film 7 to have a film thickness equal to or larger than the height of the fins FA and FB, and the conductor film 8 is subjected to a CMP process, thereby forming the conductor film 8 having a flat main surface. Next, the insulating film 9 is deposited on the main surface of the conductor film 8. The conductor film 8 is made of a polysilicon film (silicon film) and the insulating film 9 is made of a silicon nitride film. Incidentally, it is essential to make the conductor film 8 remain on the main surfaces of the fins FA and FB in the CMP process of the conductor film 8.

Figure 14:
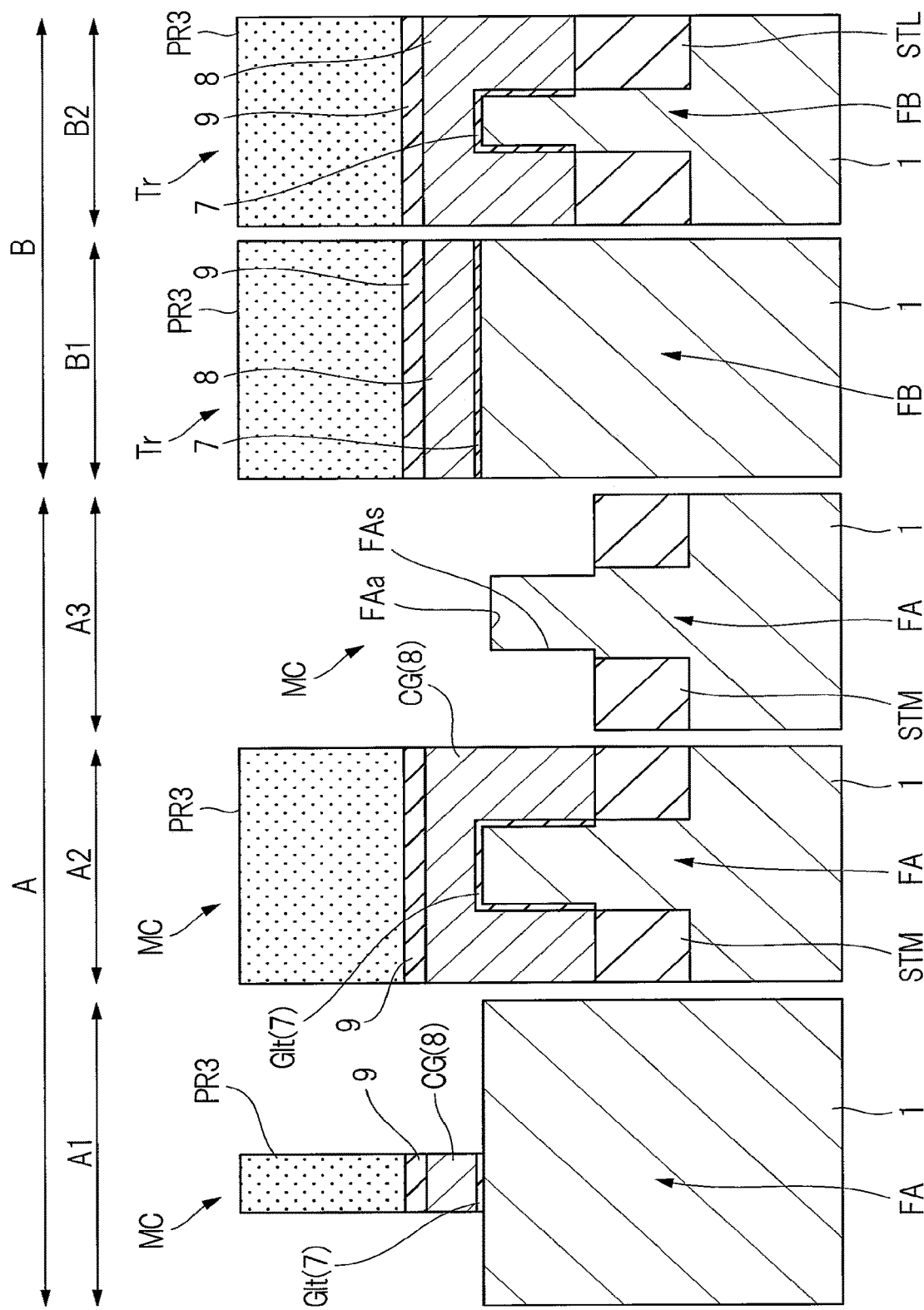
FIG. 14 is a cross-sectional view showing the principal part in the manufacturing process of the semiconductor device subsequent to FIG. 13.

FIG. 14 shows a process of forming the control gate electrode CG (Step S7). A resist film PR3 is selectively formed on the insulating film 9. The resist film PR3 has a pattern that covers a formation region of the control gate electrode CG and exposes the other region in the memory cell section A. Further, the resist film PR3 has a pattern that covers the logic section B. The insulating film 9 and the conductor film 8 are subjected to a dry etching process, and the insulating film 9 and the conductor film 8 in a region exposed from the resist film PR3 are removed, thereby forming the control gate electrode CG. By processing the insulating film 7 through use of the dry etching process or the subsequent cleaning process, the gate insulating film GIt is formed below the control gate electrode CG. Incidentally, the insulating film 9, the conductor film 8 and the insulating film 7 are removed in the memory cell section A3, so that the main surface FAa and the side surface FAs of the fin FA are exposed. Incidentally, the resist film PR3 is removed after patterning the insulating film 9 or after patterning the insulating film 9 and the conductor film 8.

Figure 15:
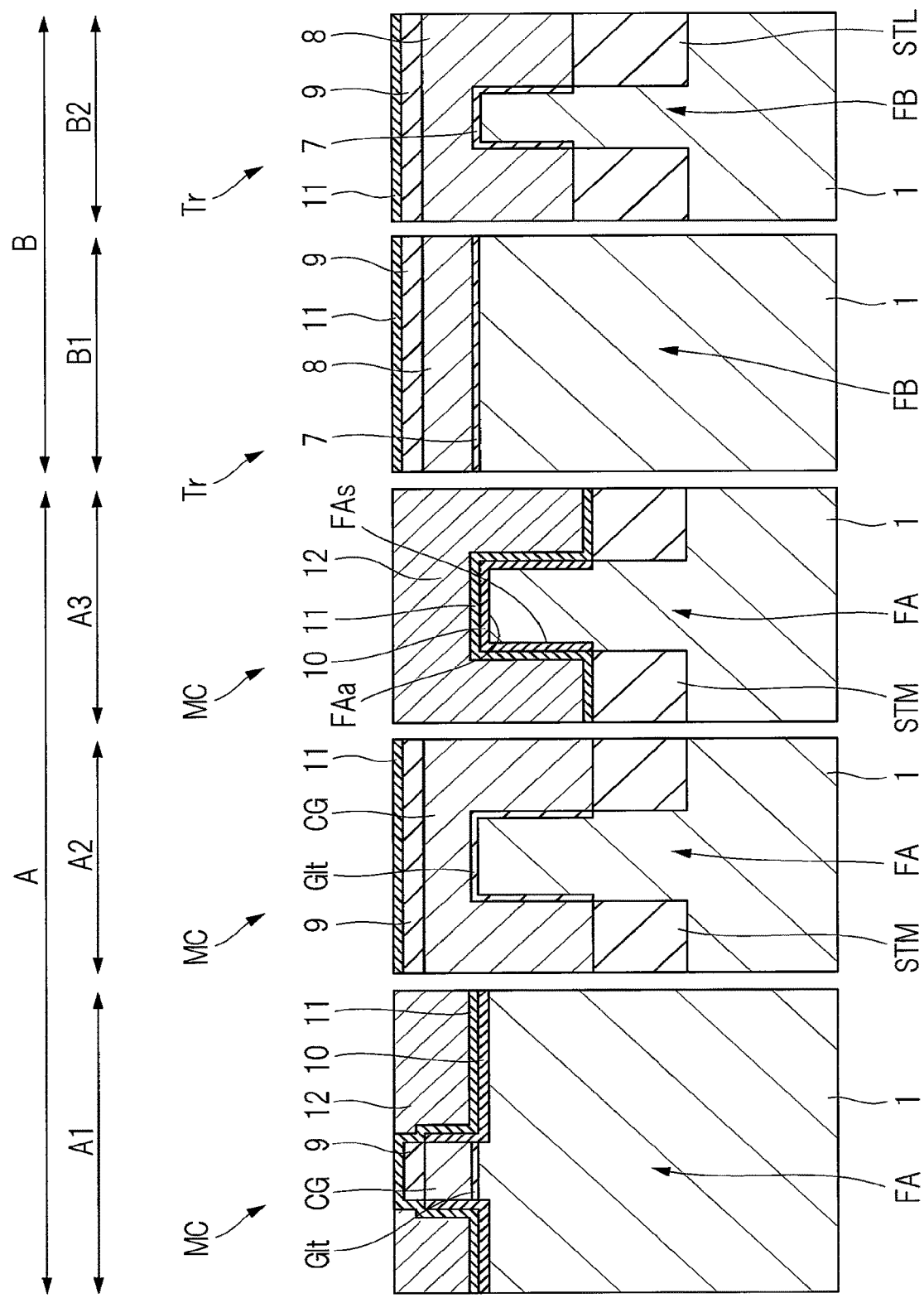
FIG. 15 is a cross-sectional view showing the principal part in the manufacturing process of the semiconductor device subsequent to FIG. 14.

FIG. 15 shows a process of forming insulating films 10 and 11 and a conductor film 12 (Step S8). First, the insulating films 10 and 11 are sequentially formed on the main surface FAa and the side surface FAs of the fin FA exposed from the control gate electrode CG. The insulating film 10 is a silicon oxide film which is formed by thermally oxidizing the main surface FAa and the side surface FAs of the fin FA, and has a film thickness of 4 nm which is thicker than the gate insulating film GIt. Next, the insulating film 11 is made of a stacked film including a silicon nitride film and a silicon oxynitride film on the silicon nitride film, in which the silicon nitride film has a film thickness of 7 nm and the silicon oxynitride film has a film thickness of 9 nm. Incidentally, the insulating film 11 maybe formed as a stacked film including a lower layer of HfSiO and an upper layer as AlO.

Next, the conductor film 12 is deposited on the insulating film 11 so as to have a film thickness equal to or larger than the height of a stacked body including the control gate electrode CG and the insulating film 9 and the height of the fin FA of the memory cell section A3. Further, this conductor film 12 is subjected to a CMP process to expose the insulating film 11 on the control gate electrode CG, so that the conductor film 12 is selectively formed in the region exposed from the control gate electrode CG of the memory cell section A as shown in FIG. 15. The conductor film 12 remains on the fin FA in the memory cell section A3 after the CMP process. Incidentally, the conductor film 12 is made of a polysilicon film (silicon film). Incidentally, the conductor film 12 is removed and the insulating film 11 is exposed in the logic section B.

Figure 16:
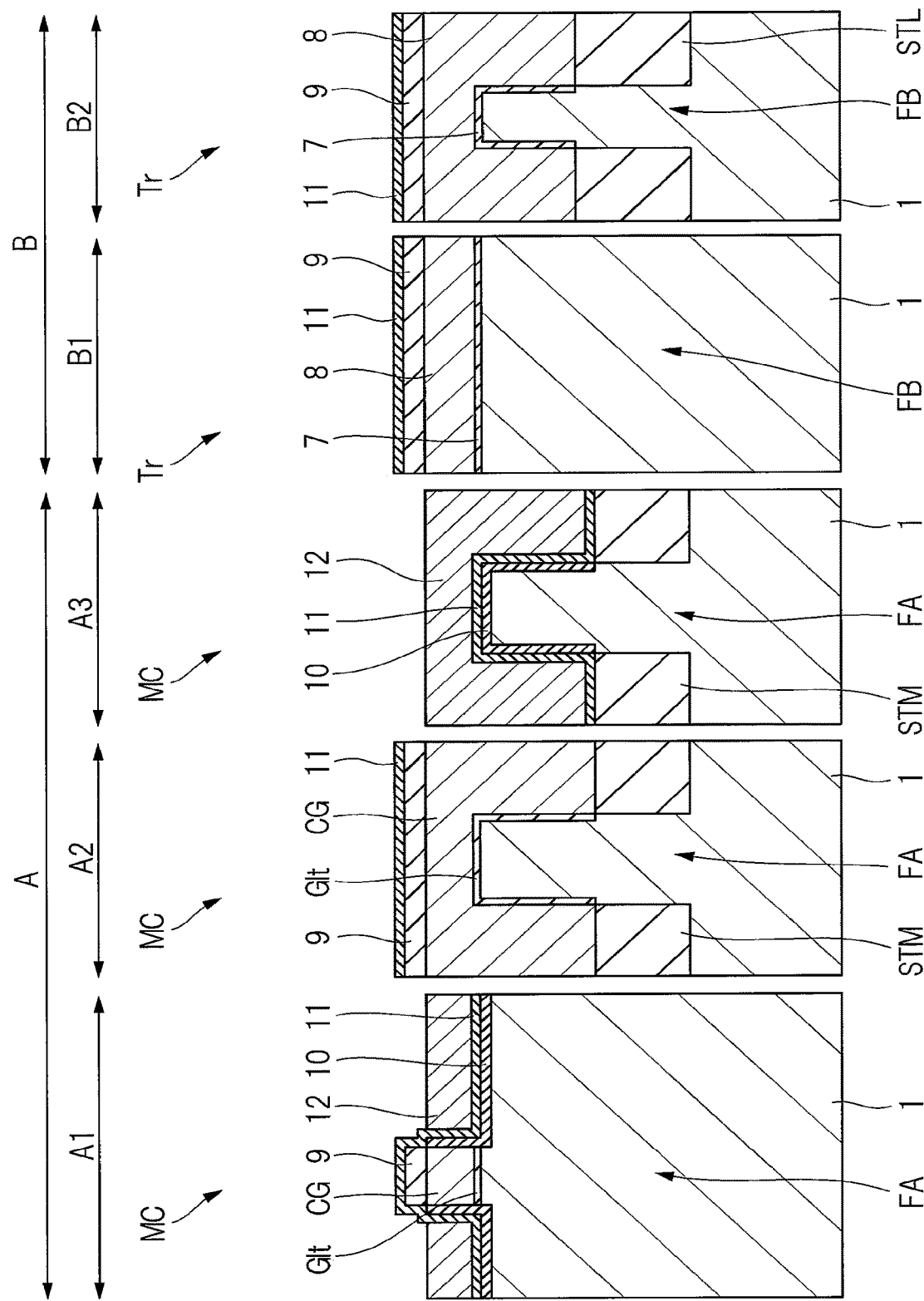
FIG. 16 is a cross-sectional view showing the principal part in the manufacturing process of the semiconductor device subsequent to FIG. 15.

FIG. 16 shows an etch-back process of the conductor film 12 (Step S9). The conductor film 12 of the memory cell section A is subjected to an etching process to lower the height of the main surface of the conductor film 12. The main surface of the conductor film 12 has substantially the same height as, for example, the main surface of the control gate electrode CG after the etch-back process.

Figure 17:
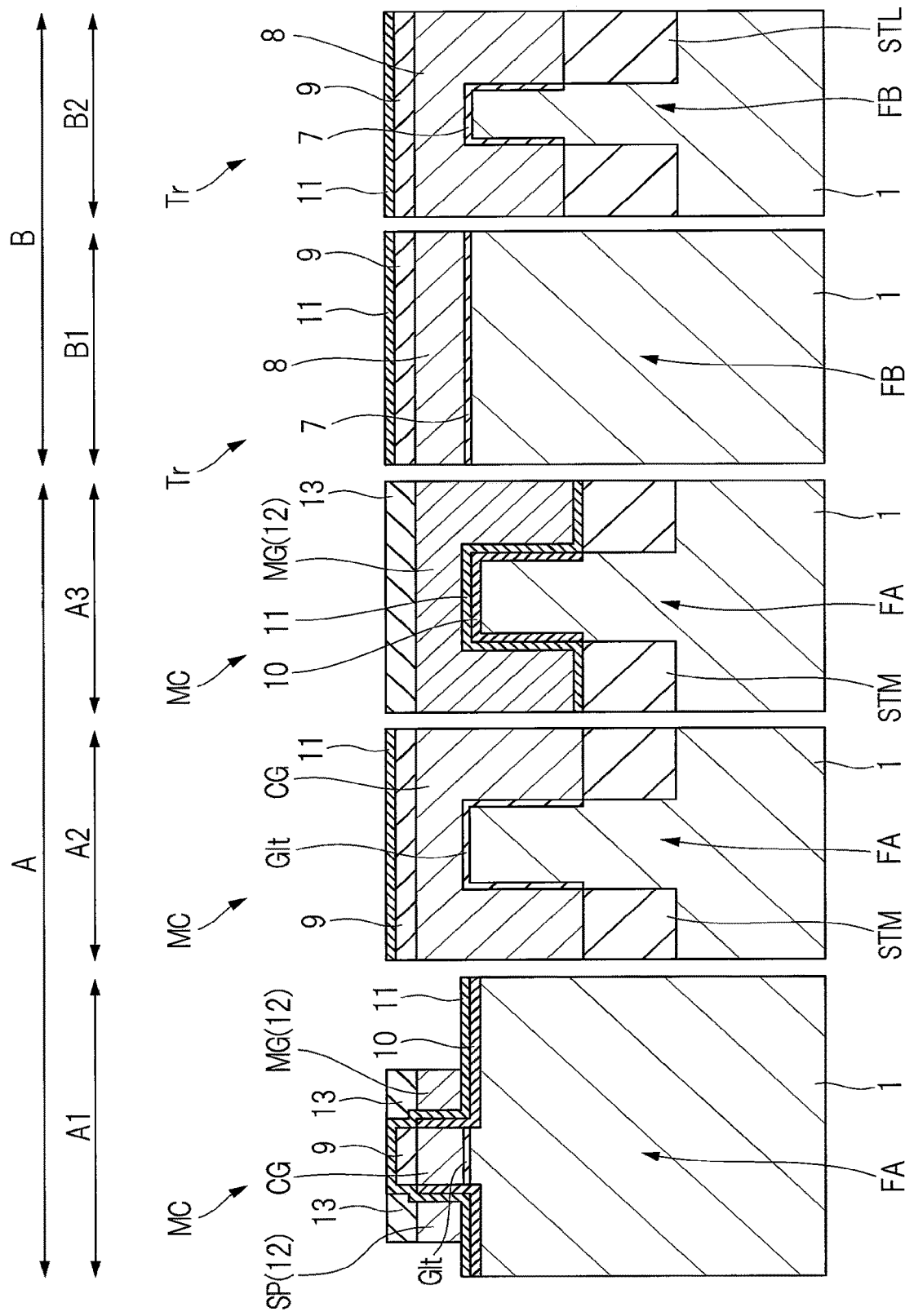
FIG. 17 is a cross-sectional view showing the principal part in the manufacturing process of the semiconductor device subsequent to FIG. 16.

FIG. 17 shows a process of forming the memory gate electrode MG (Step S10). A silicon nitride film is deposited on side walls of the insulating films 9 and 11 on the control gate electrode CG and on the conductor film 12, and is then subjected to an anisotropic dry etching, thereby forming a mask film 13 on the side walls of the insulating films 9 and 11 on the control gate electrode CG. Further, the conductor film 12 exposed from the mask film 13 is subjected to an etching process to be removed, thereby forming the memory gate electrode MG and a spacer SP on the side walls of the control gate electrode CG via the insulating films 10 and 11. Incidentally, the spacer SP has the same structure as the memory gate electrode MG, but is removed in the process to be described later, and is thus referred differently from the memory gate electrode MG.

Figure 18:
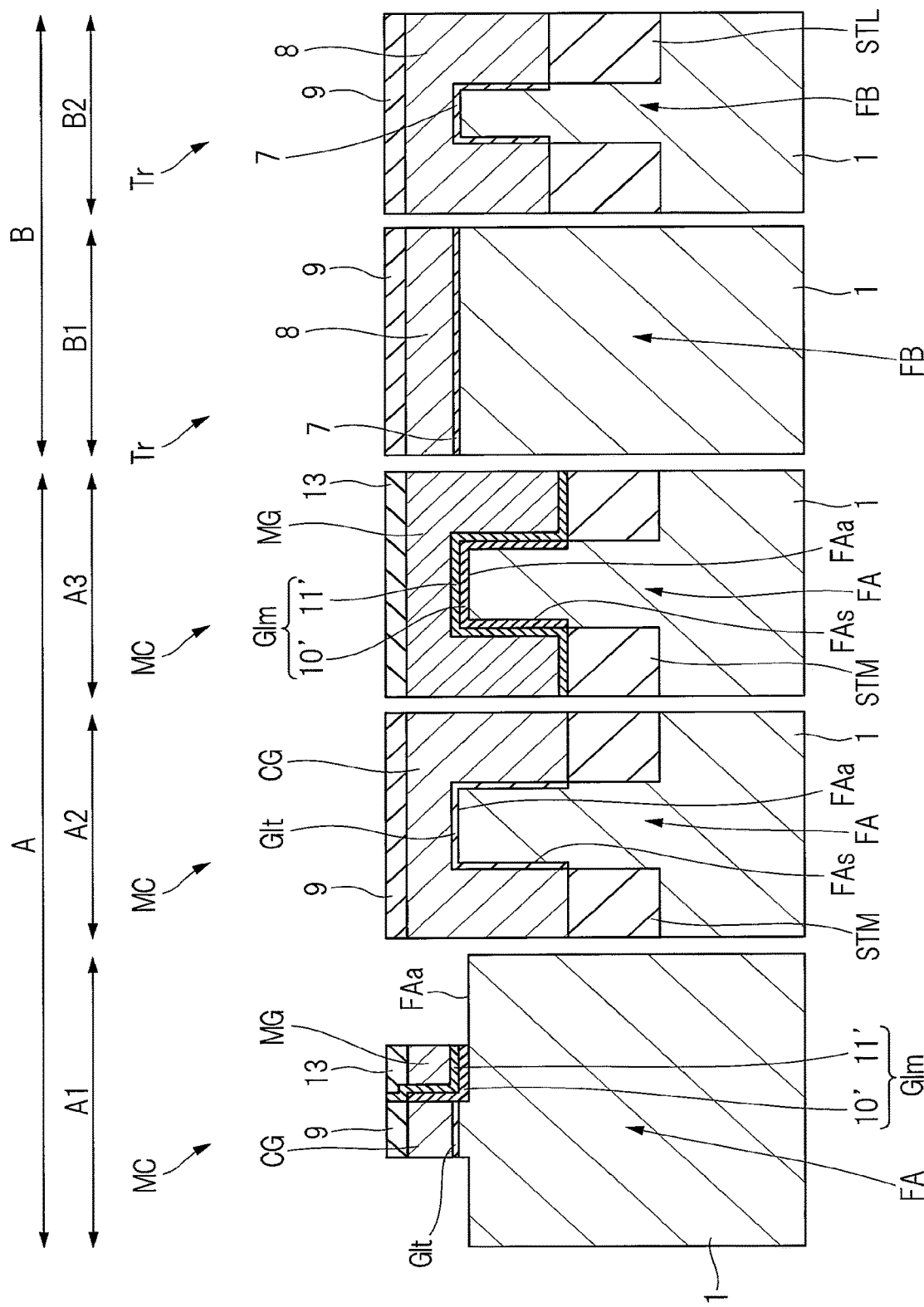
FIG. 18 is a cross-sectional view showing the principal part in the manufacturing process of the semiconductor device subsequent to FIG. 17.

FIG. 18 shows a process of removing the spacer SP and forming the gate insulating film GIm (Step S11). First, the mask film 13 and the spacer SP shown in FIG. 17 are removed by, for example, a wet etching process using a resist film (not illustrated) that covers the memory gate electrode MG and exposes the spacer SP. Subsequently, the insulating films 11 and 10 in a region exposed from the memory gate electrode MG are removed by, for example, a wet etching process to selectively leave insulating films 11' and 10' below the memory gate electrode MG (that is, between the memory gate electrode MG and the fin FA), thereby forming the gate insulating film GIm. Incidentally, the gate insulating film GIm is continuously formed not only between the main surface FAa of the fin FA and the memory gate electrode MG but also between the control gate electrode CG and the memory gate electrode MG. In addition, the gate insulating film GIm is formed along the main surface FAa and the side surface FAs of the fin FA as shown in FIG. 18.

Figure 19:
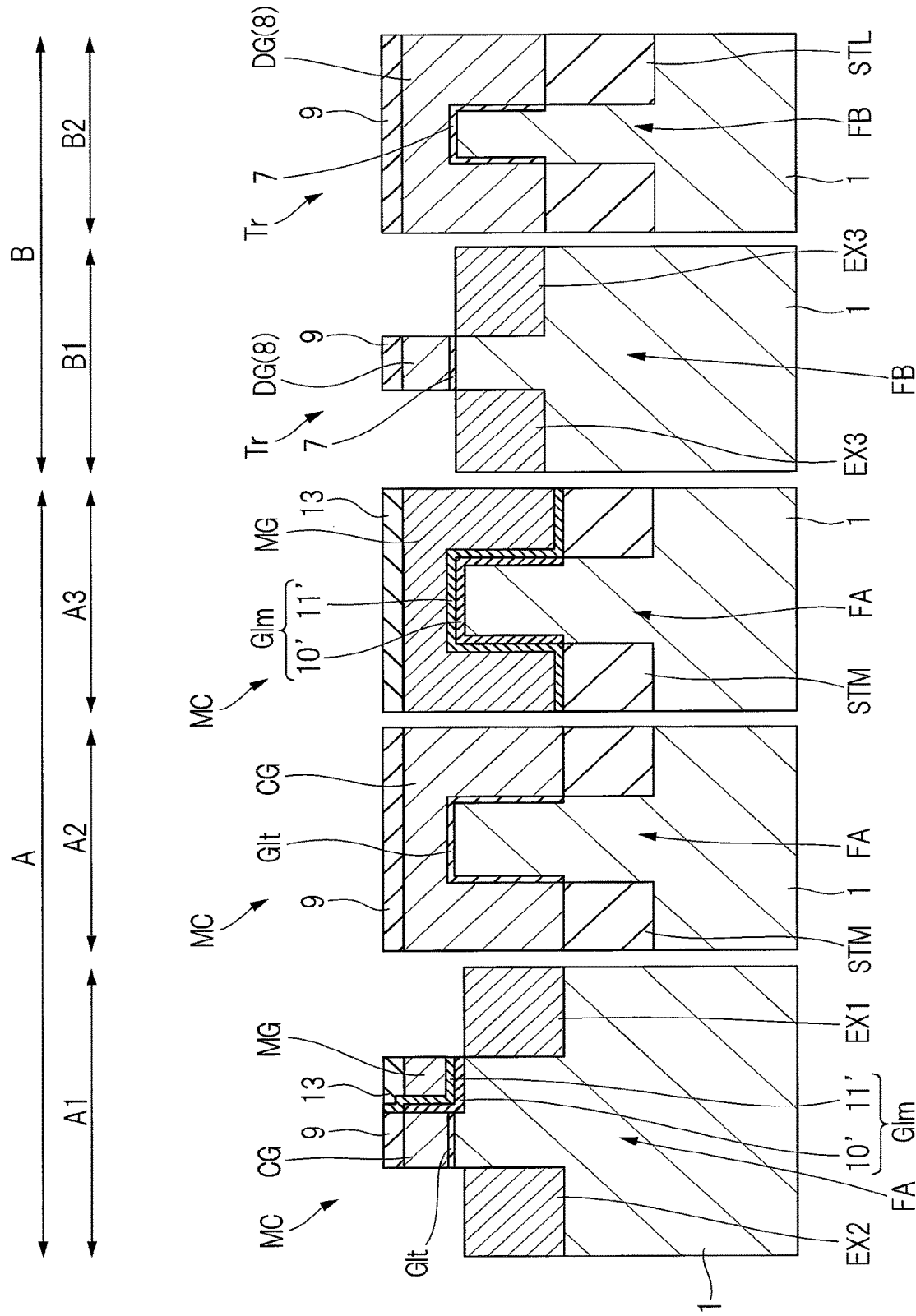
FIG. 19 is a cross-sectional view showing the principal part in the manufacturing process of the semiconductor device subsequent to FIG. 18.

FIG. 19 shows a process of forming a dummy gate DG and the n⁻ semiconductor regions (impurity-diffused layers) EX1, EX2 and EX3 (Step S12). First, the insulating film 9 and the conductor film 8 are patterned to form the dummy gate DG in the logic section B. The insulating film 9 on the dummy gate DG and the insulating film 7 below the dummy gate DG also have the same planer pattern as the dummy gate DG.

Next, the n⁻ semiconductor regions EX1 and EX2 are formed in the fin FA and the n⁻ semiconductor region EX3 is formed in the fin FB by introducing an n-type impurity such as arsenic (As) or phosphorus (P) into the fins FA and FB through use of an ion implantation method. The n⁻ semiconductor regions EX1 and EX2 are formed in a self-aligned manner with respect to the control gate electrode CG and the memory gate electrode MG. Namely, the n-type impurity is implanted into the main surface and the side surface of the fin FA exposed from the control gate electrode CG and the memory gate electrode MG, and thus, the n⁻ semiconductor regions EX1 and EX2 are formed on both sides of the control gate electrode CG and the memory gate electrode MG so as to sandwich the control gate electrode CG and the memory gate electrode MG. Since the impurity is diffused by the heat treatment after the ion implantation, the n⁻ semiconductor region EX1 partially overlaps the memory gate electrode MG, and the n⁻ semiconductor region EX2 partially overlaps the control gate electrode CG.

The n⁻ semiconductor region EX3 is formed in a self-aligned manner with respect to the dummy gate DG. Namely, the n-type impurity is implanted into the main surface and the side surface of the fin FB exposed from the dummy gate DG, and thus, the n⁻ semiconductor regions EX3 are formed on both sides of the dummy gate DG so as to sandwich the dummy gate DG. Since the impurity is diffused by the heat treatment after the ion implantation, the n⁻ semiconductor region EX3 partially overlaps the dummy gate DG.

Figure 20:
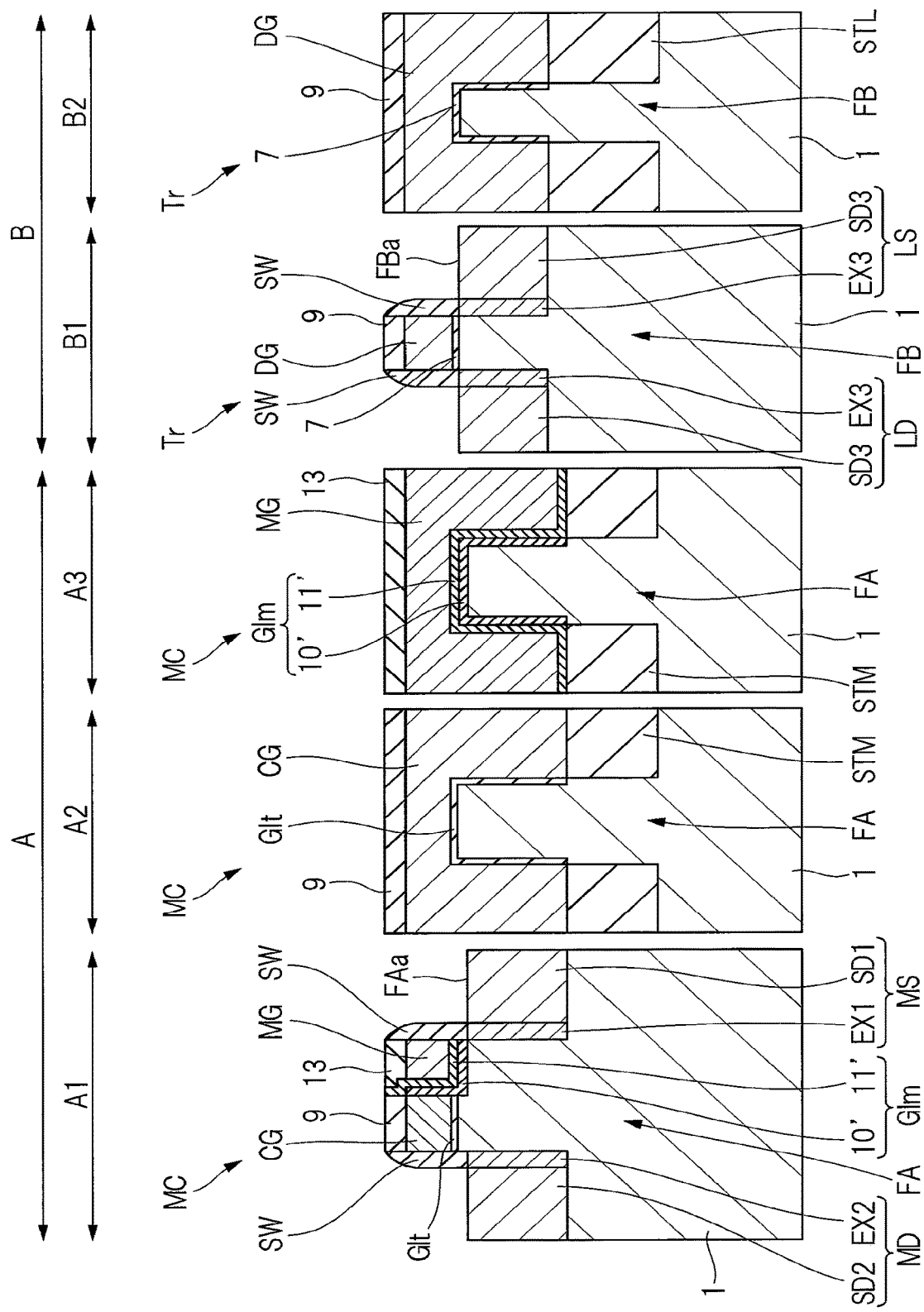
FIG. 20 is a cross-sectional view showing the principal part in the manufacturing process of the semiconductor device subsequent to FIG. 19.

FIG. 20 shows a process of forming the sidewall spacer (sidewall or sidewall insulating film) SW and the n⁺ semiconductor regions (impurity-diffused layers) SD1, SD2 and SD3 (Step S13). An insulating film which is made of, for example, a silicon oxide film, a silicon nitride film or a stacked film thereof is deposited on the semiconductor substrate 1 so as to cover the main surfaces FAa and FBa of the fins FA and FB, and then, the insulating film is subjected to an anisotropic dry etching. In this manner, the sidewall spacer SW is formed on the side walls of the control gate electrode CG and the insulating film 9 and on the side walls of the memory gate electrode MG and the mask film 13 in the memory cell section A1. In addition, the sidewall spacer SW is formed on the side walls of the dummy gate DG and the insulating film 9 in the logic section B1. The insulating film for formation of the sidewall spacer SW is removed and the insulating film 9 or the mask film 13 is exposed in the memory cell sections A2 and A3 and the logic section B2 through the above-described anisotropic dry etching.

Next, the n⁺ semiconductor regions SD1 and SD2 are formed by introducing an n-type impurity such as arsenic (As) or phosphorus (P) into the fin FA by an ion implantation method using the control gate electrode CG, the memory gate electrode MG and the sidewall spacer SW as a mask (ion implantation blocking mask). In addition, the n⁺ semiconductor regions SD3 are simultaneously formed so as to sandwich the dummy gate DG by introducing an n-type impurity such as arsenic (As) or phosphorus (P) into the fin FB by an ion implantation method using the dummy gate electrode DG and the sidewall spacer SW as a mask (ion implantation blocking mask).

In this manner, an n-type semiconductor region which functions as the source region MS of the memory cell MC is formed of the n⁻ semiconductor region EX1 and the n⁺ semiconductor region SD1 having a higher impurity concentration than the n⁻ semiconductor region EX1, and an n-type semiconductor region which functions as the drain region MD of the memory cell MC is formed of the n⁻ semiconductor region EX2 and the n⁺ semiconductor region SD2 having a higher impurity concentration than the n⁻ semiconductor region EX2. In addition, n-type semiconductor regions which function as the source region LS and the drain region LD of the transistor Tr of the logic section B are formed of the n⁻ semiconductor regions EX3 and the n⁺ semiconductor regions SD3 having a higher impurity concentration than the n⁻ semiconductor region EX3.

Figure 21:
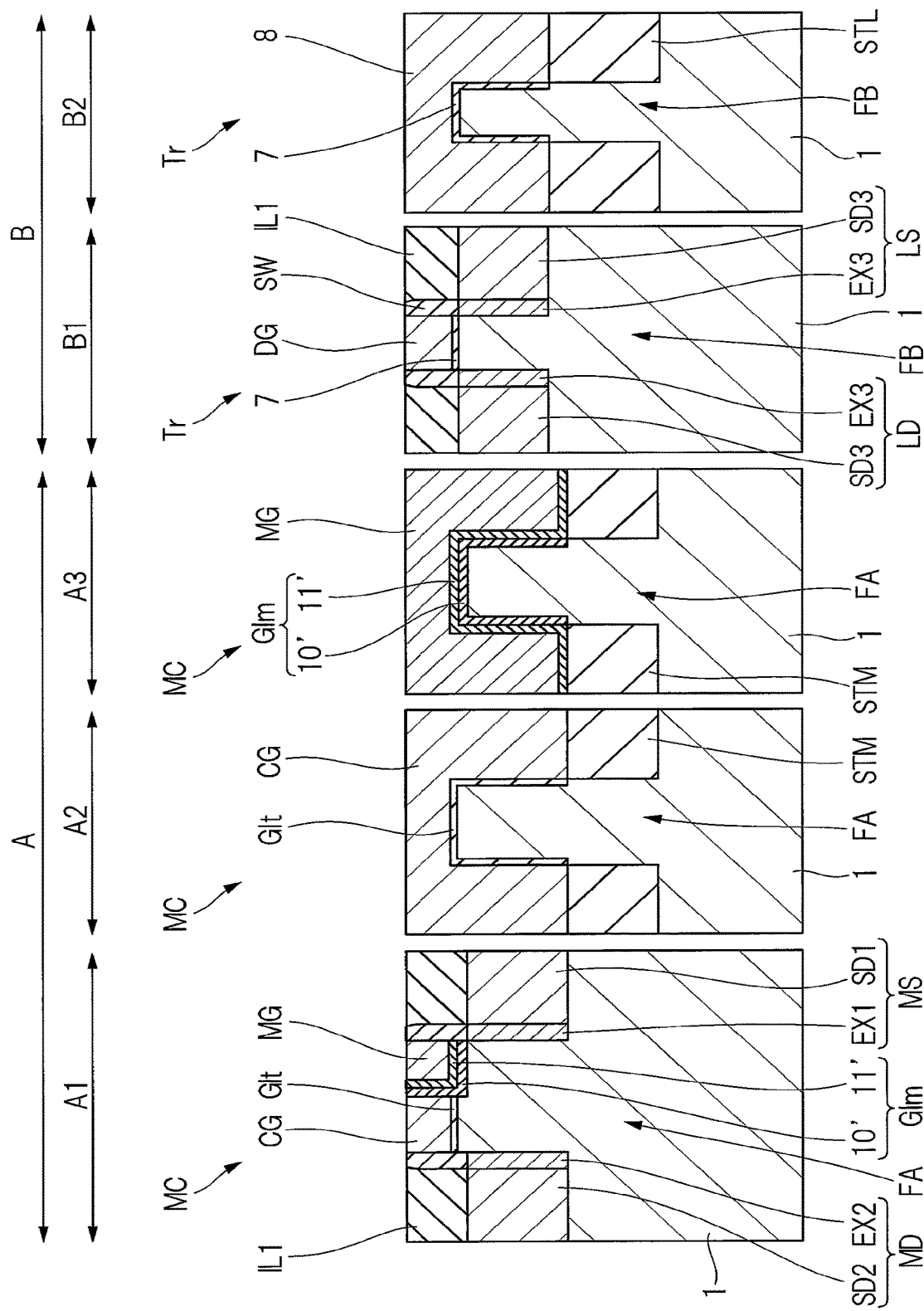
FIG. 21 is a cross-sectional view showing the principal part in the manufacturing process of the semiconductor device subsequent to FIG. 20.

FIG. 21 shows a process of forming the interlayer insulating film IL1 (Step S14). The interlayer insulating film IL1 is formed (deposited) on the semiconductor substrate 1. The interlayer insulating film IL1 is made of, for example, a single film of a silicon oxide film or a stacked film including a silicon nitride film and a silicon oxide film formed on the silicon nitride film to be thicker than the silicon nitride film, and can be formed by the CVD method or the like. Next, an upper surface of the interlayer insulating film IL1 is polished (subjected to a polishing process) by the CMP method or the like. As shown in FIG. 21, each upper surface of the control gate electrode CG, the memory gate electrode MG and the dummy gate DG is exposed. Namely, the insulating film 9 and the mask film 13 which have been formed on the control gate electrode CG, the memory gate electrode MG and the dummy gate DG are completely removed in this polishing process. Of course, some of the sidewalls SW positioned on side walls of the insulating film 9 and the mask film 13 are also removed.

Figure 22:
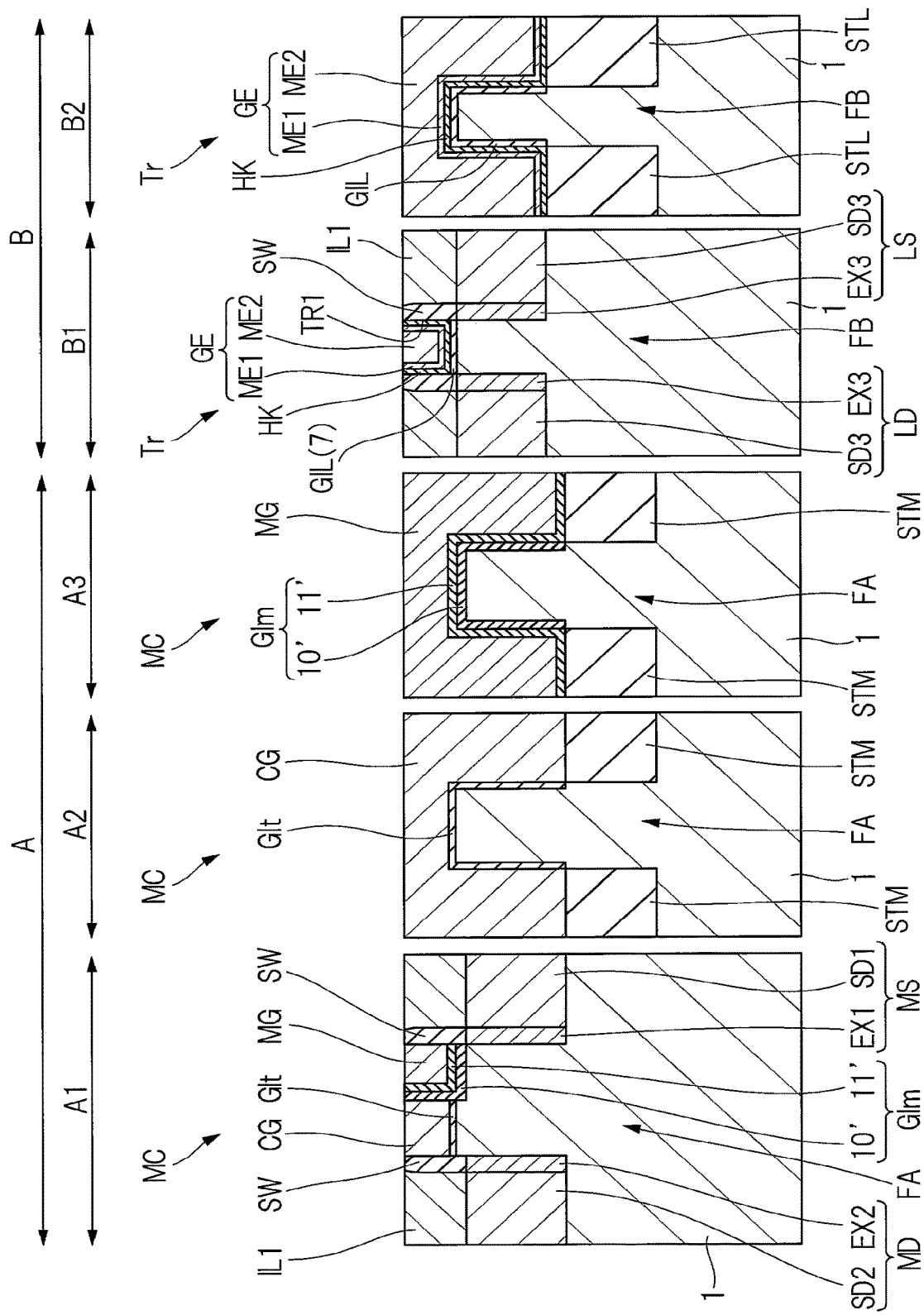
FIG. 22 is a cross-sectional view showing the principal part in the manufacturing process of the semiconductor device subsequent to FIG. 21.

FIG. 22 shows a process of forming the gate electrode GE (Step S15). First, a process of removing the exposed dummy gate DG shown in FIG. 21 is performed. By removing the dummy gate DG, a trench TR1 is formed in the interlayer insulating film IL1. A bottom portion (bottom surface) of the trench TR1 is formed of an upper surface of the insulating film 7, and a side wall (side surface) of the trench TR1 is formed of the side surface of the sidewall spacer SW (side surface that has been in contact with the dummy gate DG before removing the dummy gate DG).

Next, a process of forming the insulating film HK, the metal film ME1 and the metal film ME2 in which the insulating film HK, the metal film ME1 and the metal film ME2 are sequentially deposited on the semiconductor substrate 1, that is, on the insulating film 7 inside (on the bottom portion and the side wall of) the trench TR1 is performed as shown in FIG. 22. Further, the insulating film HK, the metal film ME1 and the metal film ME2 are subjected to a CMP process. In this manner, a stacked structure including the gate insulating film GIL made of the insulating film 7, the insulating film HK, the metal film ME1 and the metal film ME2 is selectively formed in the trench TR1. Here, the insulating film HK is an insulating material film which has a higher dielectric constant (relative dielectric constant) than silicon nitride, that is, a so-called High-k film (high-dielectric-constant film).

It is possible to use a metal oxide film such as a hafnium oxide film, a zirconium oxide film, an aluminum oxide film, a tantalum oxide film or a lanthanum oxide film as the insulating film HK. The insulating film HK can be formed by, for example, the ALD (Atomic Layer Deposition) method or the CVD method.

For example, the metal film ME1 can be a titanium aluminum (TiAl) film and the metal film ME2 can be an aluminum (Al) film. In addition, a titanium (Ti) film, a titanium nitride (TiN) film or a stacked film thereof may be interposed between the metal film ME1 and the metal film ME2 to adjust a threshold voltage of the transistor Tr.

The insulating film HK is formed on the bottom portion (bottom surface) and the side wall of the trench TR1, and a bottom portion (bottom surface) and side walls (side surfaces) of the gate electrode GE are adjacent to the insulating film HK. The insulating film GIL and the insulating film HK are interposed between the gate electrode GE and the fin FB of the semiconductor substrate 1, and the insulating film HK is interposed between the gate electrode GE and the sidewall spacer SW. The gate insulating film GIL and the insulating film HK immediately below the gate electrode GE function as the gate insulating film of the transistor Tr, but the insulating film HK is the high-dielectric-constant film, and thus functions as a high-dielectric-constant gate insulating film.

Figure 23:
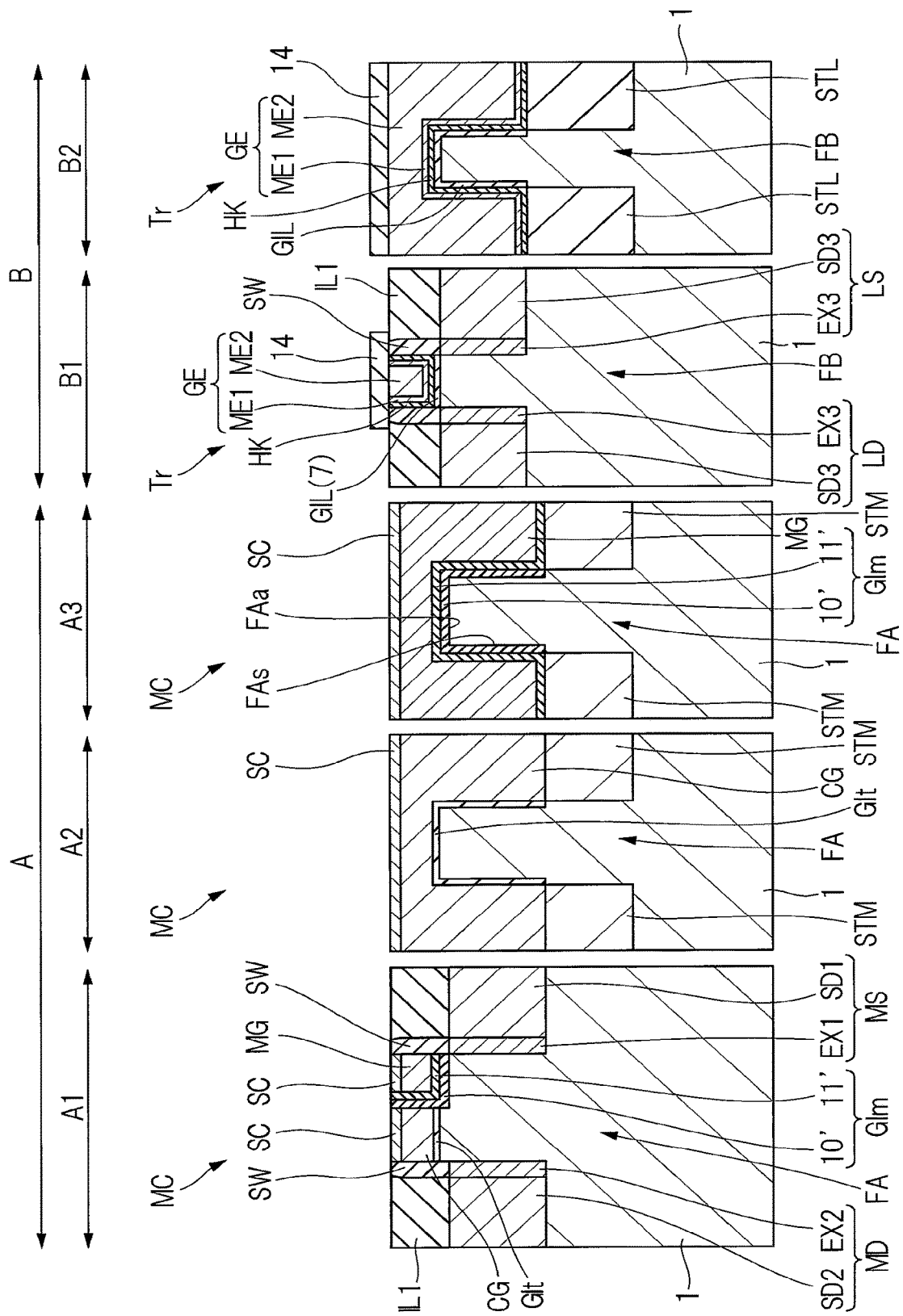
FIG. 23 is a cross-sectional view showing the principal part in the manufacturing process of the semiconductor device subsequent to FIG. 22.

FIG. 23 shows a process of forming the silicide layer SC (Step S16). First, a process of forming an insulating film 14 with a predetermined pattern on the semiconductor substrate 1 is performed. The insulating film 14 is made of, for example, a silicon oxide film and can be formed by the CVD method or the like. The insulating film 14 has a pattern (planar shape) to cover the gate electrode GE of the transistor Tr of the logic section B and expose the memory cell section A when seen in a plan view.

Next, a metal film is formed on the semiconductor substrate 1 and is subjected to heat treatment, thereby forming the silicide layer SC on the main surfaces of the control gate electrode CG and the memory gate electrode MG. Preferably, the silicide layer SC can be a cobalt silicide layer (in a case in which the metal film is a cobalt film), a nickel silicide layer (in a case in which the metal film is a nickel film), or a platinum-added nickel silicide layer (in a case in which the metal film is a nickel platinum alloy film). Thereafter, the unreacted metal film is removed by a wet etching or the like. FIG. 23 shows a cross-sectional view at this step. In addition, it is also possible to perform heat treatment again after removing the unreacted metal film. In addition, no silicide layer is formed on the gate electrode GE.

Next, a process of forming the interlayer insulating film IL2, the plug electrode PG and the metal wiring MW (Step S17) will be described with reference to FIG. 3. The interlayer insulating film IL2 is formed on the silicide layer SC. The interlayer insulating film IL2 can be formed of, for example, a silicon-oxide-based insulating film having silicon oxide as a main component. An upper surface of the interlayer insulating film IL2 is polished by the CMP method after forming the interlayer insulating film IL2, thereby enhancing flatness of the upper surface of the interlayer insulating film IL2.

Next, the contact hole (opening portion or through-hole) CT is formed in the interlayer insulating films IL1 and IL2. The contact hole CT exposes each surface of the source region MS and the drain region MD of the memory cell MC and the source region LS and the drain region LD of the transistor Tr.

Next, the conductive plug electrode PG made of tungsten (W) or the like is formed in the contact hole CT as a conductive member for connection. The plug electrode PG has a stacked structure including a barrier conductor film (for example, a titanium film, a titanium nitride film or a stacked film thereof) and a main conductor film (tungsten film) positioned on the barrier conductor film. The plug electrode PG is in contact with and electrically connected to the source region MS and the drain region MD of the memory cell MC and the source region LS and the drain region LD of the transistor Tr.

Next, the metal wiring MW is formed on the interlayer insulating film IL2. The metal wiring MW has a stacked structure including a barrier conductor film (for example, a titanium nitride film, a tantalum film or a tantalum nitride film) and a main conductor film (copper film) formed on the barrier conductor film. In FIG. 3, the barrier conductor film and the main conductor film of the metal wiring MW are illustrated as an integrated film for the simplification of the drawing. In addition, the same goes for the plug electrode PG.

<Operation of Non-Volatile Memory>

Next, an operation example of the non-volatile memory will be described with reference to FIG. 25.

Figures 24, 25:
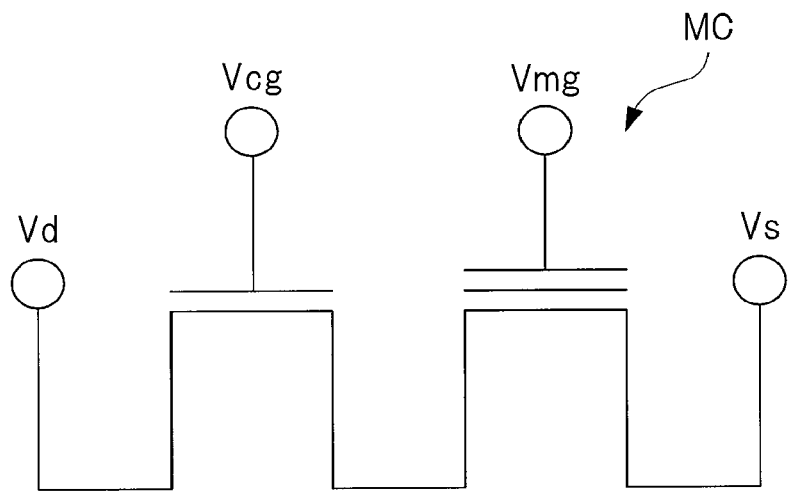
FIG. 24 is an equivalent circuit diagram of a memory cell.
FIG. 25 is a table showing an example of application conditions of voltages to each part of a selection memory cell at the time of "write", "erase" and "read"

FIG. 24 is an equivalent circuit diagram of the memory cell MC of the non-volatile memory. FIG. 25 is a table showing an example of application conditions of voltages to each part of a selection memory cell at the time of "write", "erase" and "read". The table of FIG. 25 shows a voltage Vmg, a voltage Vs, a voltage Vcg, a voltage Vd and a voltage Vb which are respectively applied to the memory gate electrode MG, the source region MS, the control gate electrode CG, the drain region MD and the p-type well PW1 of the memory cell (selection memory cell) shown in FIG. 24 at the time of "write", "erase" and "read". Incidentally, a preferable example of the application conditions of the voltages is shown in the table of FIG. 25, and the present invention is not limited thereto, and various modifications can be made if necessary. In addition, the injection of electrons into the silicon nitride film which is the charge accumulation section in the insulating film 11' of the memory transistor is defined as the "write", and the injection of the hole is defined as the "erase" in this embodiment.

A writing method (hot electron injection writing method) in which the write is performed by injecting hot electrons by the source side injection (SSI), that is, a so-called SSI method can be used as the writing method. For example, the voltages shown in the row of "write" in FIG. 25 are applied to each part of the selection memory cell to perform the write, so that electrons are injected into the silicon nitride film of the insulating film 11' of the selection memory cell and the write is performed. At this time, hot electrons are generated in a channel region (between a source and a drain) below a portion between two gate electrodes (the memory gate electrode MG and the control gate electrode CG), and the hot electrons are injected into the silicon nitride film which is the charge accumulation section of the insulating film 11' below the memory gate electrode MG. The injected hot electrons (electrons) are captured at a trap level of the silicon nitride film of the insulating film 11', so that a threshold voltage of the memory transistor increases. Namely, the memory transistor is turned into a write state.

An erasing method (hot hole injection erasing method) in which the erase is performed by injecting hot holes by the band-to-band tunneling (BTBT) phenomenon, that is, a so-called BTBT method can be used as the erasing method. Namely, the erase is performed by injecting the holes generated through the BTBT (band-to-band tunneling) phenomenon into the charge accumulation section (the silicon nitride film of the insulating film 11'). For example, the voltages shown in the row of "erase" in FIG. 25 are applied to each part of the selection memory cell to perform the erase, and holes are generated through the BTBT phenomenon and accelerated by an electric field, so that the holes are injected into the silicon nitride film of the insulating film 11' of the selection memory cell, thereby decreasing the threshold voltage of the memory transistor. Namely, the memory transistor is turned into an erase state.

At the time of read, for example, the voltages shown in the row of "read" in FIG. 25 are applied to each part of the selection memory cell to perform the read. By setting the voltage Vmg, which is applied to the memory gate electrode MG at the time of read, to be a value between the threshold voltage of the memory transistor in the write state and the threshold voltage of the memory transistor in the erase state, it is possible to determine the write state or the erase state.

<Major Characteristics and Effects>

Next, major characteristics and effects of this embodiment will be described.

The semiconductor device according to this embodiment includes the fin FA that protrudes from the main surface 1a of the semiconductor substrate 1 in the direction orthogonal to the main surface 1a, and the fin FA extends in the X-direction and has the width in the Y-direction. Further, the control gate electrode CG and the memory gate electrode MG extend in the Y-direction so as to intersect the fin FA, the gate insulating film GIt is interposed between the fin FA and the control gate electrode CG, and the gate insulating film GIm is interposed between the fin FA and the memory gate electrode MG. Further, since the film thickness of the gate insulating film GIm is larger than the film thickness of the gate insulating film GIt, the width WM1 of the fin FA in the region (portion) intersecting the memory gate electrode MG is smaller than the width WC1 of the fin FA in the region (portion) intersecting the control gate electrode CG. Here, each film thickness of the gate insulating films GIt and GIm means an equivalent oxide thickness (EOT).

The width WM1 of the fin FA in a portion across which the memory gate electrode MG is laid with the gate insulating film GIm having the relatively large film thickness interposed therebetween is made smaller than the width WC1 of the fin in a portion across which the control gate electrode CG is laid with the gate insulating film GIt having the relatively small film thickness interposed therebetween. By this means, a short channel effect of the fin FA in the portion overlapped with the memory gate electrode MG can be sufficiently suppressed and a gate length (width in the X-direction) of the memory gate electrode MG can be reduced, so that the reduction in size of the memory cell MC can be achieved. In addition, since it is possible to set the threshold to be low, high-speed operation and low power consumption can be achieved.

Incidentally, the short channel effect in a general MISFET is a phenomenon in which a gate length of a gate electrode is shortened and a threshold of the MISFET decreases, so that a subthreshold leakage (leakage current at the off-time) increases.

In addition, the semiconductor device according to this embodiment includes the fins FA and FB that protrude from the main surface 1a of the semiconductor substrate 1 in the direction orthogonal to the main surface 1a, and the fins FA and FB extend in the X-direction and have the width in the Y-direction. Further, the memory gate electrode MG extends in the Y-direction so as to intersect the fin FA, the gate insulating film GIm is interposed between the fin FA and the memory gate electrode MG, the gate electrode GE extends in the Y-direction so as to intersect the fin FB, and the gate insulating film GIL and the insulating film HK are interposed between the fin FB and the gate electrode GE. Further, the width WM1 of the fin FA in a portion intersecting the memory gate electrode MG is larger than the width WL1 of the fin FB in a portion intersecting the gate electrode GE.

By increasing the width WM1 of the fin FA in a portion across which the memory gate electrode MG is laid, it is possible to reduce a variation of the width WM1 of the fin FA after forming the insulating film 10' constituting the gate insulating film GIm as compared to a case in which the width WM1 of the fin FA is not increased, and thus the number of writes and the retention time of the memory cell MC increase. In addition, the area of the gate insulating film GIm including the charge accumulation section is enlarged, so that the number of writes and the retention time of the memory cell MC increase.

In addition, by reducing the width WL1 of the fin FB constituting the transistor Tr of the logic section B, it is possible to sufficiently suppress the short channel effect of the transistor Tr even in a case in which an operation voltage (Vdd=0.9 V) is lower than an operation voltage (Vdd=1.5 V) of the memory cell MC, so that the gate length of the transistor Tr can be reduced and the reduction in size of the transistor Tr can be achieved. In addition, since it is possible to set the threshold of the transistor Tr to be low, the high-speed operation and the low power consumption can be achieved.

Further, in the semiconductor device according to this embodiment, the height HM1 of the fin FA in a portion intersecting the memory memory gate electrode MG is larger than the height HL1 of the fin FB in a portion intersecting the gate electrode GE.

Accordingly, the area of the gate insulating film GIm including the charge accumulation section is enlarged, so that the number of writes and the retention time of the memory cell MC increase. In addition, since the height HL1 of the fin FB of the transistor Tr of the logic section B is small, it is possible to reduce the amount of current flowing in the transistor Tr, so that the power consumption of the logic circuit can be reduced.

In addition, in the manufacturing method of the semiconductor device of this embodiment, the control gate electrode CG is formed after forming the gate insulating film GIt on the main surface FAa and the side surface FAs of the fin FA by the thermal oxidation method, and the memory gate electrode MG is formed after forming the insulating film 10' constituting the gate insulating film GIm on the main surface FAa and the side surface FAs of the fin FA by the thermal oxidation method. Further, since the film thickness of the insulating film 10' constituting the gate insulating film GIm is larger than the film thickness of the gate insulating film GIt, the width WM1 of the fin FA in a portion intersecting the memory gate electrode MG can be made smaller than the width WC1 of the fin FA in a portion intersecting the control gate electrode CG.

As described above, since the width WM1 of the fin FA in a portion across which the memory gate electrode MG is laid is made smaller than the width WC1 of the fin in a portion across which the control gate electrode CG is laid, it is possible to sufficiently suppress the short channel effect of the fin FA in the portion overlapped with the memory gate electrode MG, so that the gate length (width in the X-direction) of the memory gate electrode MG can be reduced and the reduction in size of the memory cell MC can be achieved.

In the manufacturing method of the semiconductor device according to this embodiment, the gate insulating film GIt is formed also in a formation region of the memory gate electrode MG when the gate insulating film GIt is formed on the main surface FAa and the side surface FAs of the fin FA, the gate insulating film GIt in the formation region of the memory gate electrode MG is removed after forming the control gate electrode CG, and then, the insulating film 10' constituting the gate insulating film GIm is formed in the formation region of the memory gate electrode MG by the thermal oxidation method. Since the width WM1 of the fin FA in the formation region of the memory gate electrode MG is reduced approximately by the amount corresponding to a sum of each film thickness of the gate insulating film GIt and the insulating film 10', it is possible to further reduce the width WM1 of the fin FA in the formation region of the memory gate electrode MG.

MODIFICATION EXAMPLE 1

The modification example 1 is a modification example of the above-described embodiment, and is different from the embodiment in that a height HM1' of the fin FA of the memory cell section A3 is made smaller than a height HL1' of the fin FB of the logic section B2. The other characteristics are the same as those in the above-described embodiment. Namely, the height of the fin becomes smaller in the order of the height HC1 of the fin FA of the memory cell section A2, the height HL1' of the fin FB of the logic section B2 and the height HM1' of the fin FA of the memory cell section A3 (HC1>HL1'>HM1'). Incidentally, the width of the fin becomes smaller in the order of the width WC1 of the fin FA of the memory cell section A2, the width WM1 of the fin FA of the memory cell section A3 and the width WL1 of the fin FB of the logic section B2 like in the above-described embodiment (WC1>WM1>WL1).

Next, a manufacturing method of a semiconductor device according to the modification example 1 will be described. The manufacturing method of the semiconductor device according to the modification example 1 is the same as the manufacturing method of the semiconductor device according to the above-described embodiment, but is different in the "process of forming the element isolation films STM and STL (Step S5)". The process of forming the element isolation film STM of the memory cell section A described with reference to FIG. 11 is not performed in the modification example 1. The element isolation film STL is formed in the logic section B and the element isolation film STM is formed in the memory cell section A in the process of forming the element isolation film STL of the logic section B described with reference to FIG. 10. Namely, the height HA of the fin FA exposed from the element isolation film STM and the height HB of the fin FB exposed from the element isolation film STL are made equal to each other without adjusting each height of the fins FA and FB. Specifically, the semiconductor substrate 1 in which the width WA of the fin FA is larger than the width WB of the fin FB and the height HA of the fin FA is the same as the height HB of the fin FB is prepared (WA>WB, HA=HB). Then, the memory cell MC and the transistor Tr are formed in the same manner as the manufacturing method according to the above-described embodiment.

Since the film thickness of the insulating film 10' constituting the gate insulating film GIm is larger than the film thickness of the gate insulating film GIL and the insulating film 10' and the gate insulating film GIL are the thermal oxide films, the height HM1' of the fin FA in a portion intersecting the memory gate electrode MG can be made smaller than the height HL1' of the fin FB in a portion intersecting the gate electrode GE.

Since the height HL1' of the fin FB of the logic section B2 is made larger, it is possible to improve the driving capability of the transistor Tr of the logic section B, and the high-speed operation of the logic circuit can be achieved. Further, since the height HM1' of the fin FA of the memory cell section A3 is made smaller, it is possible to improve the yield in the process of forming the memory gate electrode MG.

Here, the process of forming the memory gate electrode MG will be described with reference to FIGS. 2 and 17. As shown in FIG. 17, the conductor film 12 present between the two neighboring memory gate electrodes MG shown in FIG. 2 is removed when the conductor film 12 exposed from the mask film 13 is removed by the etching process using the mask film 13. The cross-sectional view of a portion between the memory gate electrodes MG in the Y-direction before the removal of the conductor film 12 is the same as the cross-sectional view of the memory cell section A3 of FIG. 17 (but the mask film 13 is not present). Namely, the relatively thin conductor film 12 is present on the fin FA and the relatively thick conductor film 12 with a height larger than that of the fin FA is present on the element isolation film STM on the outer side of the fin FA. Since the thin conductor film 12 and the thick conductor film 12 described above are removed in the etching process of the conductor film 12, it is possible to improve the yield of the etching process by lowering the height of the fin FA.

MODIFICATION EXAMPLE 2

The modification example 2 is a modification example of the above-described embodiment.

Figure 26:
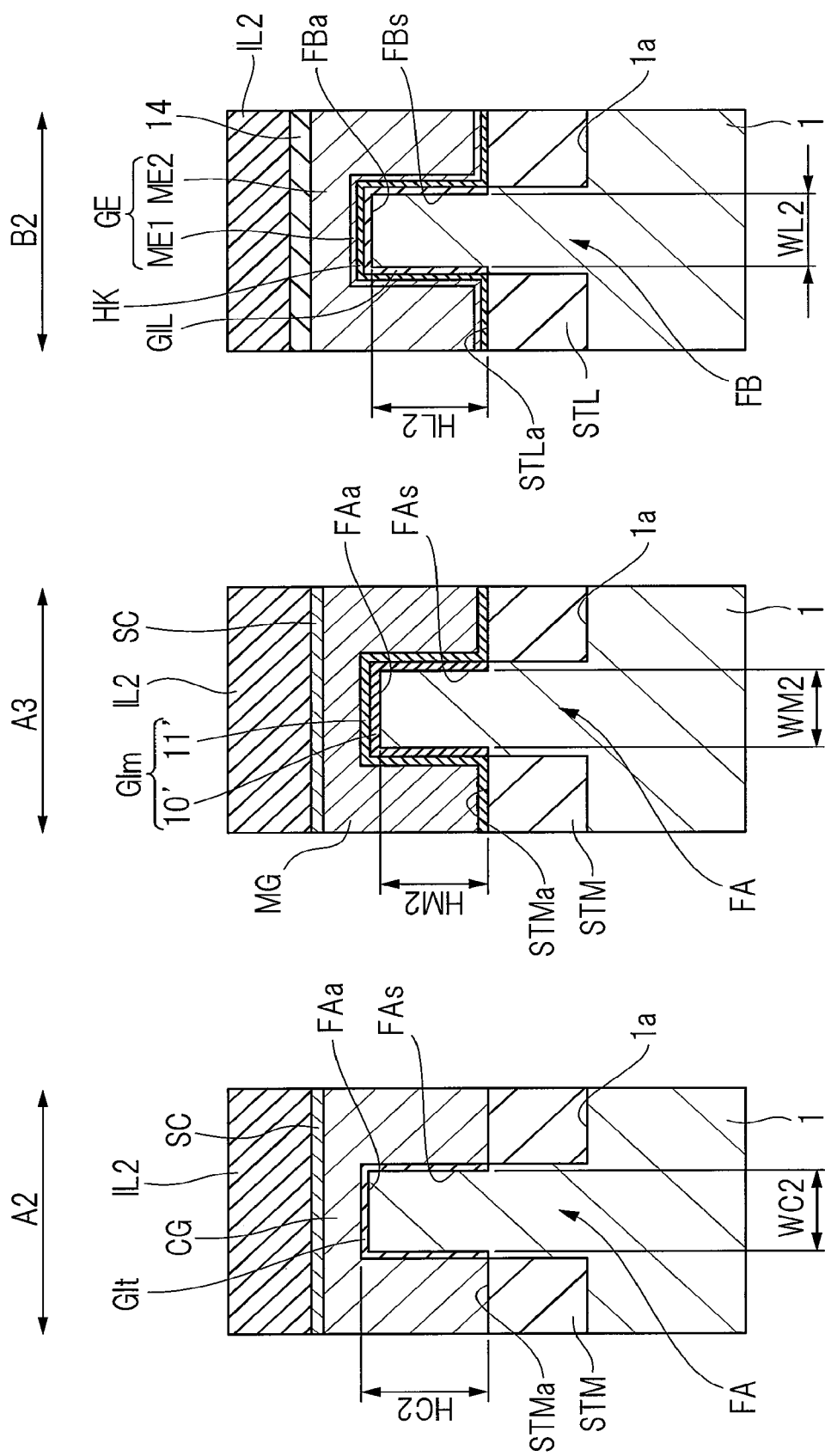
FIG. 26 is a cross-sectional view showing the principal part of a semiconductor device according to the modification example 2.

FIG. 26 is a cross-sectional view showing the principal part of a semiconductor device according to the modification example 2. FIG. 26 shows the shape of the fin FA in each of the memory cell sections A2 and A3 and the shape of the fin FB in the logic section B2. The modification example 2 differs in that a width WM2 of the fin FA of the memory cell section A3 is made smaller than a width WL2 of the fin FB of the logic section B2 and a height HM2 of the fin FA of the memory cell section A3 is made smaller than a height HL2 of the fin FB of the logic section B2. Accordingly, the width of the fin becomes smaller in the order of a width WC2 of the fin FA of the memory cell section A2, the width WL2 of the fin FB of the logic section B2 and the width WM2 of the fin FA of the memory cell section A3 (WC2>WL2>WM2). Further, the height of the fin becomes smaller in the order of a height HC2 of the fin FA of the memory cell section A2, the height HL2 of the fin FB of the logic section B2 and the height HM2 of the fin FA of the memory cell section A3 (HC2>HL2>HM2).

Next, a manufacturing method of the semiconductor device according to the modification example 2 will be described. The manufacturing method of the semiconductor device according to the modification example 2 is the same as the manufacturing method of the semiconductor device according to the above-described embodiment, but the "process of slimming the hard mask film 5 (Step S3)" and the "process of adjusting each height of the fins FA and FB" are not performed. Namely, the semiconductor substrate 1 in which the width WA of the fin FA is the same as the width WB of the fin FB and the height HA of the fin FA is the same as the height HB of the fin FB is prepared (WA=WB, HA=HB). Then, the memory cell MC and the transistor Tr are formed in the same manner as the manufacturing method according to the above-described embodiment.

The film thickness of the insulating film 10' constituting the gate insulating film GIm is larger than each film thickness of the gate insulating films GIt and GIL, and the insulating film 10' and the gate insulating films GIt and GIL are the thermal oxide films. Thus, the width WM2 and the height HM2 of the fin FA in a portion intersecting the memory gate electrode MG can be made smaller than the width WC2 and the height HC2 of the fin FA in a portion intersecting the control gate electrode CG and the width WL2 and the height HL2 of the fin FB in a portion intersecting the gate electrode GE.

By reducing the width WM2 of the fin FA in a portion intersecting the memory gate electrode MG, it is possible to sufficiently suppress the short channel effect of the fin FA in a portion overlapped with the memory gate electrode MG, so that the gate length (width in the X-direction) of the memory gate electrode MG can be reduced and the reduction in size of the memory cell MC can be achieved. Further, by increasing the width WL2 of the fin FB constituting the transistor Tr of the logic section B, it is possible to suppress a variation in characteristics such as the threshold and to improve the driving capability.

By increasing the height HL2 of the fin FB of the logic section B2, it is possible to improve the driving capability of the transistor Tr of the logic section B, and the high-speed operation of the logic circuit can be achieved. Further, by reducing the height HM2 of the fin FA of the memory cell section A3, it is possible to improve the yield in the process of forming the memory gate electrode MG.

MODIFICATION EXAMPLE 3

The modification example 3 is a modification example of the modification example 2. The modification example 3 differs in that a height HM2' of the fin FA of the memory cell section A3 is made larger than a height HL2' of the fin FB of the logic section B2. The other characteristics are the same as those in the modification example 2. Namely, the width of the fin becomes smaller in the order of the width WC2 of the fin FA of the memory cell section A2, the width WL2 of the fin FB of the logic section B2 and the width WM2 of the fin FA of the memory cell section A3 (WC2>WL2>WM2). Further, the height of the fin becomes smaller in the order of the height HC2 of the fin FA of the memory cell section A2, the height HM2' of the fin FA of the memory cell section A3 and the height HL2' of the fin FB of the logic section B2 (HC2>HM2'>HL2').

Next, a manufacturing method of a semiconductor device according to the modification example 3 will be described. The manufacturing method of the semiconductor device according to the modification example 3 is the same as the manufacturing method of the semiconductor device according to the modification example 2, but the "process of slimming the hard mask film 5 (Step S3)" is not performed and the "process of adjusting each height of the fins FA and FB" is performed. Namely, the semiconductor substrate 1 in which the width WA of the fin FA is the same as the width WB of the fin FB and the height HA of the fin FA is higher than the height HB of the fin FB is prepared (WA=WB, HA>HB). Further, the memory cell MC and the transistor Tr are formed in the same manner as the modification example 2 described above.

Since the height HM2' of the fin FA in a portion intersecting the memory gate electrode MG is larger than the height HL2' of the fin FB in a portion intersecting the gate electrode GE, the area of the gate insulating film GIm including the charge accumulation section is enlarged, so that the number of writes and the retention time of the memory cell MC increase. In addition, since the height HL2' of the fin FB of the transistor Tr of the logic section B is small, it is possible to reduce the power consumption of the logic circuit.

MODIFICATION EXAMPLE 4

The modification example 4 is a modification example of the above-described embodiment. The modification example 4 differs from the above-described embodiment in a structure of a gate electrode of a memory cell. Although the memory cell MC of the above-described embodiment includes the control gate electrode CG and the memory gate electrode MG, a memory cell MC2 of the modification example 4 includes a memory gate electrode MG2, but does not include a control gate electrode. The same reference characters as those in the above-described embodiment are used except for the memory gate electrode MG2.

Figure 27:
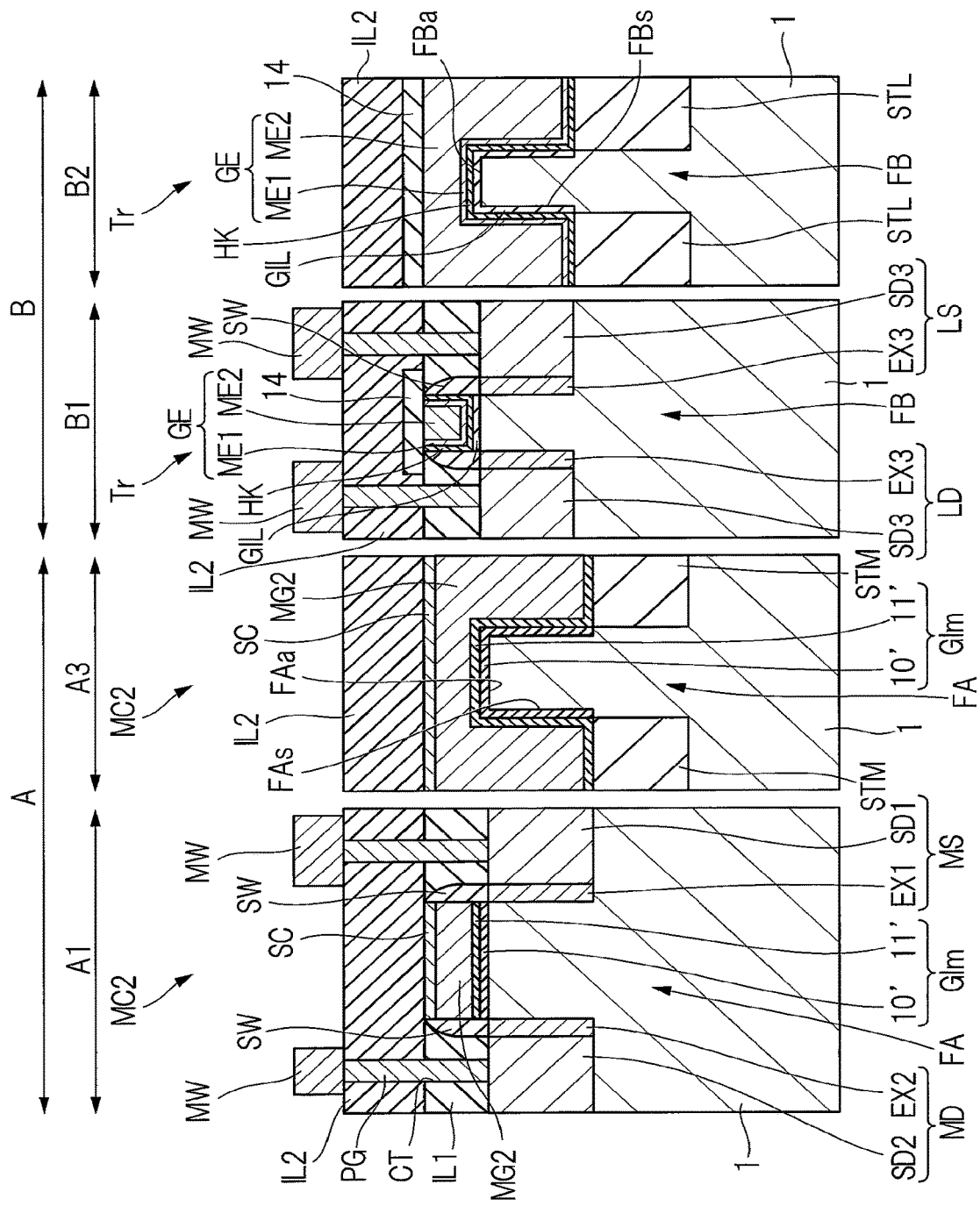
FIG. 27 is a cross-sectional view showing the principal part of a semiconductor device according to the modification example 4.

FIG. 27 is a cross-sectional view showing the principal part of a semiconductor device according to the modification example 4. FIG. 27 shows two cross-sectional views of the memory cell section A and two cross-sectional views of the logic section B. FIG. 28 is a cross-sectional view showing the principal part of the semiconductor device according to the modification example 4. FIG. 28 shows the shape of the fin FA in the memory cell section A3 and the shape of the fin FB in the logic section B2.

As shown in FIG. 27, the memory cell MC2 is formed on the main surface FAa and the side surface FAs of the fin FA and includes the memory gate electrode MG2, the gate insulating film GIm, the source region MS and the drain region MD. The gate insulating film GIm has a stacked structure including the insulating films 10' and 11', and the insulating film 11' is formed of a stacked film including a silicon nitride film serving as a charge accumulation section (charge accumulating layer) and a silicon oxynitride film that covers a surface of the silicon nitride film. A film thickness of the gate insulating film GIm is larger than a sum of each film thickness of the gate insulating film GIL and the insulating film HK.

As shown in FIG. 28, a width WM3 of the fin FA of the memory cell section A3 is larger than a width WL3 of the fin FB of the logic section B2, and a height HM3 of the fin FA of the memory cell section A3 is larger than a height HL3 of the fin FB of the logic section B2 (WM3>WL3, HM3>HL3).

By increasing the width WM3 of the fin FA in a portion across which the memory gate electrode MG2 is laid, it is possible to reduce a variation of the width WM3 of the fin FA after forming the insulating film 10' constituting the gate insulating film GIm as compared to a case in which the width WM3 of the fin FA is not increased, and thus the number of writes and the retention time of the memory cell MC2 increase. In addition, the area of the gate insulating film GIm including the charge accumulation section is enlarged, so that the number of writes and the retention time of the memory cell MC2 increase.

By reducing the width WL3 of the fin FB constituting the transistor Tr of the logic section B2, it is possible to sufficiently suppress the short channel effect of the transistor Tr even in a case in which an operation voltage (Vdd=0.9 V) is lower than an operation voltage (Vdd=1.5 V) of the memory cell MC2, so that the gate length of the transistor Tr can be reduced and the reduction in size of the transistor Tr can be achieved. In addition, since it is possible to set the threshold of the transistor Tr to be low, the high-speed operation and the low power consumption can be achieved.

MODIFICATION EXAMPLE 5

The modification example 5 is a modification example of the modification example 4 described above.

A width WM3' of the fin FA of the memory cell section A3 is smaller than a width WL3' of the fin FB of the logic section B2. In addition, a height HM3' of the fin FA of the memory cell section A3 is lower than a height HL3' of the fin FB of the logic section B2 (WM3'<WL3', HM3'<HL3').

By reducing the width WM3' of the fin FA in a portion intersecting the memory gate electrode MG2, it is possible to sufficiently suppress the short channel effect of the fin FA in a portion overlapped with the memory gate electrode MG2, so that the gate length (width in the X-direction) of the memory gate electrode MG2 can be reduced and the reduction in size of the memory cell MC2 can be achieved. Further, by increasing the width WL3' of the fin FB constituting the transistor Tr of the logic section B2, it is possible to suppress a variation in characteristics such as the threshold and to improve the driving capability.

By increasing the height HL3' of the fin FB of the logic section B2, it is possible to improve the driving capability of the transistor Tr of the logic section B, and the high-speed operation of the logic circuit can be achieved. Further, by reducing the height HM3' of the fin FA of the memory cell section A3, it is possible to improve the yield in the process of forming the memory gate electrode MG2.

In the foregoing, the invention made by the inventors of the present invention has been concretely described based on the embodiments. However, it is needless to say that the present invention is not limited to the foregoing embodiments and various modifications and alterations can be made within the scope of the present invention.

In addition, some of the contents described in the above-described embodiment will be described below.

[Appendix 1]

A semiconductor device includes:

a semiconductor substrate having a main surface;

a first protruding portion that is a portion of the semiconductor substrate in a first region of the main surface, protrudes from the main surface, has a width in a first direction of the main surface, and extends in a second direction orthogonal to the first direction;

a second protruding portion that is a portion of the semiconductor substrate in a second region different from the first region, protrudes from the main surface, has a width in the first direction of the main surface, and extends in the second direction orthogonal to the first direction;

a first gate electrode that is arranged on the first protruding portion via a first insulating film and extends in the first direction;

a second gate electrode that is arranged on the second protruding portion via a second insulating film and extends in the first direction;

a first semiconductor region and a second semiconductor region that are formed in the first protruding portion so as to sandwich the first gate electrode; and a third semiconductor region and a fourth semiconductor region that are formed in the second protruding portion so as to sandwich the second gate electrode, the first insulating film includes a charge accumulating layer, and a first width of the first protruding portion in a region overlapped with the first gate electrode is smaller than a second width of the second protruding portion in a region overlapped with the second gate electrode.

[Appendix 2]

The semiconductor device described in Appendix 1 further includes:

a first element isolation film that is formed on the main surface of the semiconductor substrate and surrounds the first protruding portion when seen in a plan view; and a second element isolation film that is formed on the main surface of the semiconductor substrate and surrounds the second protruding portion when seen in a plan view.

[Appendix 3]

In the semiconductor device described in Appendix 2, a first height of the first protruding portion exposed from the first element isolation film in the region overlapped with the first gate electrode is smaller than a second height of the second protruding portion exposed from the second element isolation film in the region overlapped with the second gate electrode.

[Appendix 4]

A semiconductor device includes:

a semiconductor substrate having a main surface;

a first protruding portion that is a portion of the semiconductor substrate in a first region of the main surface, protrudes from the main surface, has a width in a first direction of the main surface, and extends in a second direction orthogonal to the first direction;

a second protruding portion that is a portion of the semiconductor substrate in a second region different from the first region, protrudes from the main surface, has a width in the first direction of the main surface, and extends in the second direction orthogonal to the first direction;

a first element isolation film that is formed on the main surface of the semiconductor substrate and surrounds the first protruding portion when seen in a plan view;

a second element isolation film that is formed on the main surface of the semiconductor substrate and surrounds the second protruding portion when seen in a plan view;

a first gate electrode that is arranged on the first protruding portion via a first insulating film and extends in the first direction;

a second gate electrode that is arranged on the second protruding portion via a second insulating film and extends in the first direction;

a first semiconductor region and a second semiconductor region that are formed in the first protruding portion so as to sandwich the first gate electrode; and a third semiconductor region and a fourth semiconductor region that are formed in the second protruding portion so as to sandwich the second gate electrode, the first insulating film includes a charge accumulating layer, and a first height of the first protruding portion exposed from the first element isolation film in a region overlapped with the first gate electrode is larger than a second height of the second protruding portion exposed from the second element isolation film in a region overlapped with the second gate electrode.

[Appendix 5]

A semiconductor device includes:

a semiconductor substrate having a main surface;

a first protruding portion that is a portion of the semiconductor substrate in a first region of the main surface, protrudes from the main surface, has a width in a first direction of the main surface, and extends in a second direction orthogonal to the first direction;

a second protruding portion that is a portion of the semiconductor substrate in a second region different from the first region, protrudes from the main surface, has a width in the first direction of the main surface, and extends in the second direction orthogonal to the first direction;

a first element isolation film that is formed on the main surface of the semiconductor substrate and surrounds the first protruding portion when seen in a plan view;

a second element isolation film that is formed on the main surface of the semiconductor substrate and surrounds the second protruding portion when seen in a plan view;

a first gate electrode that is arranged on the first protruding portion via a first insulating film and extends in the first direction;

a second gate electrode that is arranged on the second protruding portion via a second insulating film and extends in the first direction;

a first semiconductor region and a second semiconductor region that are formed in the first protruding portion so as to sandwich the first gate electrode; and a third semiconductor region and a fourth semiconductor region that are formed in the second protruding portion so as to sandwich the second gate electrode, the first insulating film includes a charge accumulating layer, and a first height of the first protruding portion exposed from the first element isolation film in a region overlapped with the first gate electrode is smaller than a second height of the second protruding portion exposed from the second element isolation film in a region overlapped with the second gate electrode.

[Appendix 6]

A manufacturing method of a semiconductor device includes the steps of:

(a) preparing a semiconductor substrate;

(b) forming a protruding portion that is a portion of the semiconductor substrate, protrudes from a main surface of the semiconductor substrate, has a width in a first direction of the main surface, and extends in a second direction orthogonal to the first direction;

(c) forming a first thermal oxide film in a first region of the protruding portion;

(d) forming a first gate electrode on the first thermal oxide film;

(e) forming a second thermal oxide film in a second region different from the first region of the protruding portion;

(f) forming a second gate electrode on the second thermal oxide film; and (g) forming a first semiconductor region and a second semiconductor region in the protruding portion so as to sandwich the first gate electrode and the second gate electrode, and a film thickness of the second thermal oxide film is larger than a film thickness of the first thermal oxide film.

[Appendix 7]

In the manufacturing method of the semiconductor device described in Appendix 6, the first thermal oxide film is formed also in the second region, and the step (e) is performed after removing the first thermal oxide film formed in the second region.

What is claimed is:

1. A method of manufacturing a semiconductor device, the method comprising:
   (a) preparing a semiconductor substrate having a main surface, the main surface having a first region and a second region;
   (b) forming first protruding portions in the first region and a second protruding portion in the second region, respectively, a longitudinal axis of each of the first protruding portions extending in a first direction in a plan view;
   (c) forming a first element isolation film in the main surface so as to surround each of the first protruding portions in the plan view, and a second element isolation film in the main surface so as to surround the second protruding portion in the plan view;
   (d) forming a first gate electrode over each of the first protruding portions via a first insulating film in the first region, a longitudinal axis of the first gate electrode extending in a second direction orthogonal to the first direction in the plan view;
   (e) forming a second gate electrode over each of the first protruding portions via a second insulating film in the first region such that a longitudinal axis of the second gate electrode extends in the second direction and is adjacent to the first gate electrode in the first direction in the plan view;
   (f) forming a third gate electrode over the second protruding portion via a third insulating film in the second region; and
   (g) forming first semiconductor regions in each of the first protruding portions exposed from the first gate electrode and the second gate electrode, and second semiconductor regions in the second protruding portion exposed from the third gate electrode,
   wherein a thickness of the second insulating film is larger than a thickness of the first insulating film,
   wherein the second insulating film is a stacked film forming a first silicon oxide film, a silicon nitride film serving as a charge accumulation section, and a second silicon oxide film in this order, wherein the first gate electrode, the second gate electrode, and the first semiconductor regions form a non-volatile memory cell, wherein each of the first protruding portions has a first top surface under the first gate electrode and a second top surface under the second gate electrode, and has a first height from a top surface of the first element isolation film to the first top surface and a second height from the top surface of the first element isolation film to the second top surface, wherein the second protruding portion has a third height from a top surface of the second element isolation film to a top surface of the second protruding portion, wherein the first height, the second height, and the third height are lower in this order, wherein the first gate electrode overlaps each of the first protruding portions creating a first overlapping area on each of the first protruding portions, the first overlapping area having a first width in the second direction, wherein the second gate electrode overlaps each of the first protruding portions creating a second overlapping area on each of the first protruding portions, the second overlapping area having a second width in the second direction, wherein the third gate electrode overlaps the second protruding portion creating a third overlapping area, the third overlapping area having a third width in the second direction, and wherein the first width, the second width, and the third width are smaller in this order.

2. The method of manufacturing a semiconductor device according to claim 1, wherein the third gate electrode and the second semiconductor regions form a transistor.

3. A method of manufacturing a semiconductor device, the method comprising:
(a) preparing a semiconductor substrate having a main surface, the main surface having a first region and a second region;
(b) forming first protruding portions in the first region and a second protruding portion in the second region, respectively, a longitudinal axis of the first protruding portions extending in a first direction in a plan view;
(c) forming a first element isolation film in the main surface so as to surround each of the first protruding portions in the plan view, and a second element isolation film in the main surface so as to surround the second protruding portion in the plan view;
(d) forming a first gate electrode over each of the first protruding portions via a first insulating film in the first region, a longitudinal axis of the first gate electrode extending in a second direction orthogonal to the first direction in the plan view;
(e) forming a second gate electrode over each of the first protruding portions via a second insulating film in the first region such that a longitudinal axis of the second gate electrode extends in the second direction and is adjacent to the first gate electrode in the first direction in the plan view;
(f) forming a third gate electrode over the second protruding portion via a third insulating film in the second region; and
(g) forming first semiconductor regions in each of the first protruding portions exposed from the first gate electrode and the second gate electrode, and second semiconductor regions in the second protruding portion exposed from the third gate electrode, wherein a thickness of the second insulating film is larger than a thickness of the first insulating film, wherein the second insulating film is a stacked film forming a first silicon oxide film, a silicon nitride film serving as a charge accumulation section, and a second silicon oxide film in this order, wherein the first gate electrode, the second gate electrode, and the first semiconductor regions form a non-volatile memory cell, wherein each of the first protruding portions has a stepped top surface including a first top surface under the first gate electrode and a second top surface under the second gate electrode, the second top surface is sequentially arranged from, and is lowered relative to, the first top surface, and the first top surf ace surface has a first height from a top surface of the first element isolation film to the first top surface and a second height from the top surface of the first element isolation film to the second top surface, wherein the second protruding portion has a third height from a top surface of the second element isolation film to a top surface of the second protruding portion, wherein the first height, the second height, and the third height are lower in this order, wherein the first gate electrode overlaps each of the first protruding portions creating a first overlapping area on each of the first protruding portions, the first overlapping area having a first width in the second direction, wherein the second gate electrode overlaps each of the first protruding portions creating a second overlapping area on each of the first protruding portions, the second overlapping area having a second width in the second direction, wherein the third gate electrode overlaps the second protruding portion creating a third overlapping area, the third overlapping area having a third width in a second direction, and wherein the first width, the second width, and the third width are smaller in this order.

* * * * *